US012811360B2

(12) United States Patent
Samonji et al.

(10) Patent No.: US 12,811,360 B2
(45) Date of Patent: Nov. 24, 2026

(54) METHOD OF MANUFACTURING SEMICONDUCTOR LASER ELEMENT, SEMICONDUCTOR LASER ELEMENT, AND SEMICONDUCTOR LASER DEVICE

(71) Applicant: Nuvoton Technology Corporation Japan, Kyoto (JP)

(72) Inventors: Katsuya Samonji, Toyama (JP); Hiroshi Asaka, Toyama (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 869 days.

(21) Appl. No.: 18/084,327

(22) Filed: Dec. 19, 2022

(65) Prior Publication Data

US 2023/0122494 A1 Apr. 20, 2023

Related U.S. Application Data

(63) Continuation of application No. PCT/JP2021/021099, filed on Jun. 2, 2021.

(30) Foreign Application Priority Data

Jun. 23, 2020 (JP) ................................ 2020-107450

(51) Int. Cl.
*H01S 5/40* (2006.01)
*B23K 26/364* (2014.01)
(Continued)

(52) U.S. Cl.
CPC .......... *H01S 5/0202* (2013.01); *B23K 26/364* (2015.10); *H01S 5/026* (2013.01); (Continued)

(58) Field of Classification Search
None
See application file for complete search history.

(56) References Cited

U.S. PATENT DOCUMENTS 4,237,601 A * 12/1980 Woolhouse ....... H01L 21/30617 438/33
5,780,320 A * 7/1998 Kinoshita ............. H01S 5/0201 438/33
(Continued)

FOREIGN PATENT DOCUMENTS

JP 2003-017791 A 1/2003
JP 2004-87564 A 3/2004
(Continued)

OTHER PUBLICATIONS

International Search Report issued in corresponding International Patent Application No. PCT/JP2021/021099, dated Aug. 17, 2021, with English translation.

*Primary Examiner* — Tod T Van Roy
(74) *Attorney, Agent, or Firm* — Rimon P.C.

(57) ABSTRACT

A method of manufacturing a semiconductor laser element includes: first dividing a substrate to produce a divided substrate including waveguides spaced apart in a second direction, the substrate being a substrate on which a nitride-based semiconductor laser stacking structure including waveguides extending in the first direction is formed; cleaving the divided substrate in the second direction to produce a semiconductor laser element including waveguides; and second dividing the semiconductor laser element in the first direction to remove an end portion of the semiconductor laser element in the second direction. The cleaving includes: forming, on the divided substrate, a cleavage lead-in groove extending in the second direction; and cleaving the divided substrate using the cleavage lead-in groove. In the second dividing, a portion including the cleavage lead-in groove is removed as the end portion of the semiconductor laser element in the second direction.

18 Claims, 16 Drawing Sheets

(51) Int. Cl.
*H01S 5/02* (2006.01)
*H01S 5/026* (2006.01)
*B23K 103/00* (2006.01)
*H01S 5/323* (2006.01)

(52) U.S. Cl.
CPC ........ *H01S 5/4031* (2013.01); *B23K 2103/56* (2018.08); *H01S 5/32341* (2013.01)

(56) References Cited

U.S. PATENT DOCUMENTS 6,630,366 B2 * 10/2003 Taniguchi ........... H01S 5/04256 438/42
7,649,923 B2 * 1/2010 Sakamoto ............. H01S 5/0201 372/54
7,700,413 B2 * 4/2010 Kusunoki ............ B23K 26/142 438/114
8,213,475 B2 * 7/2012 Takagi ................ H01S 5/34333 257/11
8,563,343 B2 * 10/2013 Motoda ................. H01S 5/0202 438/33
8,619,826 B2 * 12/2013 Nakashima ........... H01S 5/4031 372/29.013
8,772,064 B2 * 7/2014 Takagi ................ H01S 5/34333 438/33
9,236,710 B2 * 1/2016 Tanisaka ............... H01S 5/0207
9,972,967 B2 * 5/2018 Gerhard ................ H01S 5/0202
11,545,812 B2 * 1/2023 Mochida ............... H01S 5/0234
11,688,993 B2 * 6/2023 Brückner .................. H01S 5/22 438/33
2003/0030053 A1 * 2/2003 Kawakami ............. B82Y 20/00 257/72
2005/0076945 A1 * 4/2005 Tachibana ............... H10F 19/31 136/251
2006/0192209 A1 * 8/2006 Maeda ................... B82Y 20/00 257/79
2007/0093041 A1 4/2007 Tanaka et al.
2007/0173036 A1 * 7/2007 Kusunoki .............. H10H 20/01 257/E21.599
2008/0130698 A1 * 6/2008 Bessho ............... H01S 5/04256 372/45.01
2009/0101927 A1 4/2009 Kohda
2009/0262771 A1 * 10/2009 Inoue ..................... B82Y 20/00 438/33
2010/0240159 A1 * 9/2010 Kumagai ............... B23K 26/53 438/33
2010/0329295 A1 * 12/2010 Nakashima ........... H01S 5/0421 372/46.012
2011/0104839 A1 * 5/2011 Hiroyama ........... H01S 5/34333 257/E33.068
2011/0281382 A1 * 11/2011 Bessho ............... H01S 5/04256 438/31
2012/0100654 A1 * 4/2012 Takagi .................. H01S 5/0202 438/46
2013/0142209 A1 * 6/2013 Tanisaka ............... H01S 5/0207 438/33
2019/0035959 A1 * 1/2019 Kim .................... H10F 77/1662
2020/0021083 A1 1/2020 Ikeda et al.
2023/0122494 A1 * 4/2023 Samonji ................ H01S 5/0202 372/45.01
2023/0207392 A1 * 6/2023 Ota ...................... H10D 64/112 257/77

FOREIGN PATENT DOCUMENTS

JP 2007-073669 A 3/2007
JP 2007-103791 A 4/2007
JP 2007-201305 A 8/2007
JP 2008-060555 A 3/2008
JP 2009-081428 A 4/2009
JP 2013-118250 A 6/2013
WO 2018/180952 A1 10/2018

* cited by examiner

[Sequential order]

[Central order]

[After formation of division grooves]

SEM cross section + SEM surface (bird's-eye view)

SEM cross section

METHOD OF MANUFACTURING SEMICONDUCTOR LASER ELEMENT, SEMICONDUCTOR LASER ELEMENT, AND SEMICONDUCTOR LASER DEVICE

CROSS REFERENCE TO RELATED APPLICATIONS

This is a continuation application of PCT International Application No. PCT/JP2021/021099 filed on Jun. 2, 2021, designating the United States of America, which is based on and claims priority of Japanese Patent Application No. 2020-107450 filed on Jun. 23, 2020. The entire disclosures of the above-identified applications, including the specifications, drawings and claims are incorporated herein by reference in their entirety.

FIELD

The present disclosure relates to a method of manufacturing a semiconductor laser element, the semiconductor laser element, and a semiconductor laser device including the semiconductor laser element.

BACKGROUND

Semiconductor laser elements, which have advantages such as long life, high efficiency, and small size, are used as light sources for various applications, including image display devices such as projectors, and their applications are expanding to, for example, automotive headlamps and light sources for laser processing devices.

In recent years, semiconductor laser elements have been required to be further high-powered. For example, semiconductor laser elements used as light sources for laser processing devices are required to have high optical output power exceeding 1 watt.

In such cases, if a high-output laser beam is emitted from a single emitter (light emitter), the optical density at the front end surface from which the laser beam is emitted becomes too high, which could result in catastrophic optical damage (COD) on the front end surface.

In view of the above, there has been proposed a semiconductor laser element which has a multi-emitter structure in which a plurality of emitters are integrated to allow a single semiconductor laser element to emit a high-output laser beam (for example, Patent Literature (PTL) 1). This type of semiconductor laser element is configured as, for example, a laser bar including a plurality of waveguides.

CITATION LIST

Patent Literature

PTL 1: Japanese Unexamined Patent Application Publication No. 2007-073669

SUMMARY

Technical Problem

A semiconductor laser element including a plurality of waveguides is formed by dividing a substrate (wafer) on which a semiconductor stacking structure made of, for example, a semiconductor material such as a nitride-based semiconductor material is formed. In this case, by laser scribing, grooves for division are formed on the substrate on which the semiconductor stacking structure is formed, and the substrate is divided into a plurality of pieces by cutting and cleaving the substrate using these grooves for division.

At this time, the substrate and the semiconductor material such as a nitride crystal are melted by laser scribing and a spatter is thereby generated, so processing waste called "debris" is deposited in and around the regions in which the laser scribing has been performed.

However, the grooves for division and the debris remaining in a mounting region of the semiconductor laser element cause such defects as follows when mounting the semiconductor laser element on, for example, a submount. The defects include, for example, that the semiconductor laser element is tilted and cannot be mounted in a predetermined orientation, and that the properties of the semiconductor laser element degrade.

The basic structure of a semiconductor laser element, such as waveguides and a semiconductor stacking structure, is usually formed on the front surface side (for example, the p-side) of the substrate. On the other hand, only electrodes (for example, n-electrodes) are formed on the back surface side of the substrate. The patterning of the electrodes on the back surface side is performed by mask alignment to the shape on the front surface side (for example, the p-electrode pattern). Therefore, a misalignment occurs between the basic structure of the semiconductor laser element on the front surface side and the electrode pattern on the back surface side within the mask alignment accuracy. As will be described later, the end surface of a laser resonator produced by cleavage is desired to be formed according to the basic structure of the semiconductor laser element as accurately as possible. Therefore, it is better for the laser scribing necessary for cleavage to be performed according to the pattern on the front surface side rather than the pattern on the back surface side having a mask misalignment.

In the case of junction-down mounting (face-down mounting) the semiconductor laser element on, for example, a submount with the p-side surface of the semiconductor laser element serving as the mounting surface, the defects as described above occur during mounting if the grooves for division or debris are present in the mounting region on the p-side surface of the semiconductor laser element as a result of the laser scribing performed on the p-side surface of the semiconductor laser element. However, in order to accurately produce the resonator according to the basic structure of the semiconductor laser element, laser scribing is desired on the p-side surface. Therefore, there is a conflict between the requirements of the mounting process and the requirements of the chip processing.

The present disclosure has been conceived to solve such a problem, and has an object to provide, for example, a method of manufacturing a semiconductor laser element that can inhibit the occurrence of defects when the semiconductor laser element is mounted on, for example, a submount.

Solution to Problem

In order to achieve the above object, a method of manufacturing a semiconductor laser element according to an aspect of the present disclosure is a method of manufacturing a semiconductor laser element that includes a plurality of waveguides, the method including: first dividing a substrate in a first direction parallel to a first main surface of the substrate to produce a plurality of divided substrates each including a plurality of waveguides spaced apart in a second direction orthogonal to the first direction and parallel to the first main surface, the substrate being a substrate on which a nitride-based semiconductor laser stacking structure is formed, the nitride-based semiconductor laser stacking structure including a plurality of waveguides each extending in the first direction; cleaving, in the second direction, one divided substrate included in the plurality of divided substrates produced by the first dividing, to produce a plurality of semiconductor laser elements each including a plurality of waveguides; and second dividing, in the first direction, one semiconductor laser element included in the plurality of semiconductor laser elements produced by the cleaving, to remove at least one end portion of the one semiconductor laser element in the second direction, wherein the cleaving includes: forming a cleavage lead-in groove on the one divided substrate, the cleavage lead-in groove extending in the second direction; and cleaving the one divided substrate in the second direction using the cleavage lead-in groove, and in the second dividing, a portion including the cleavage lead-in groove is removed as the at least one end portion of the one semiconductor laser element in the second direction.

In addition, a method of manufacturing a semiconductor laser element according to another aspect of the present disclosure is a method of manufacturing a semiconductor laser element that includes a plurality of waveguides, the method including: first dividing a substrate in a first direction parallel to a first main surface of the substrate to produce a plurality of divided substrates each including a plurality of waveguides spaced apart in a second direction orthogonal to the first direction and parallel to the first main surface, the substrate being a substrate on which a nitride-based semiconductor laser stacking structure is formed, the nitride-based semiconductor laser stacking structure including a plurality of waveguides each extending in the first direction; and cleaving, in the second direction orthogonal to the first direction and parallel to the first main surface, one divided substrate included in the plurality of divided substrates produced by the first dividing, to produce a plurality of semiconductor laser elements each including a plurality of waveguides, wherein each of the plurality of semiconductor laser elements includes a first side surface parallel to the first direction and a second side surface on an opposite side relative to the first side surface, and in the semiconductor laser element, a second distance is greater than a first distance which is a shortest distance among distances between two adjacent waveguides included in the plurality of waveguides, the second distance being a distance between the first side surface and one waveguide located closest to the first side surface among the plurality of waveguides.

In addition, a semiconductor laser element according to an aspect of the present disclosure is a semiconductor laser element including: a substrate including a first main surface and a second main surface on an opposite side relative to the first main surface; a nitride-based semiconductor laser stacking structure provided above the first main surface of the substrate and including a plurality of waveguides extending in a first direction parallel to the first main surface; a first side surface orthogonal to the first main surface and parallel to the first direction, a second side surface on an opposite side relative to the first side surface, and a third side surface orthogonal to the first main surface and orthogonal to the first direction; a first region in which waveguides included in the plurality of waveguides are formed and a second region that is interposed between the first region and the first side surface; and a stepped portion provided on the first side surface, the stepped portion being recessed inwardly from a surface of the semiconductor laser element on a second main surface side when the semiconductor laser element is viewed in the first direction.

In addition, a semiconductor laser element according to another aspect of the present disclosure is a semiconductor laser element including: a substrate including a first main surface and a second main surface on an opposite side relative to the first main surface; a nitride-based semiconductor laser stacking structure provided above the first main surface of the substrate and including a plurality of waveguides extending in a first direction parallel to the first main surface; a first side surface orthogonal to the first main surface and parallel to the first direction, a second side surface on an opposite side relative to the first side surface, and a third side surface orthogonal to the first main surface and orthogonal to the first direction; and a first region in which waveguides included in the plurality of waveguides are formed and a second region that is interposed between the first region and the first side surface, wherein a second distance is greater than a first distance which is a shortest distance among distances between two adjacent waveguides included in the plurality of waveguides, the second distance being a distance between the first side surface and one waveguide located closest to the first side surface among the plurality of waveguides.

In addition, a semiconductor laser device according to an aspect of the present disclosure includes any one of the semiconductor laser elements described above and a submount on which the semiconductor laser element is mounted, and the semiconductor laser element is mounted on the submount with a surface of the semiconductor laser element on a first main surface side facing the submount.

Advantageous Effects

According to the present disclosure, it is possible to inhibit occurrence of defects when a semiconductor laser element is mounted on, for example, a submount.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Figure 1:
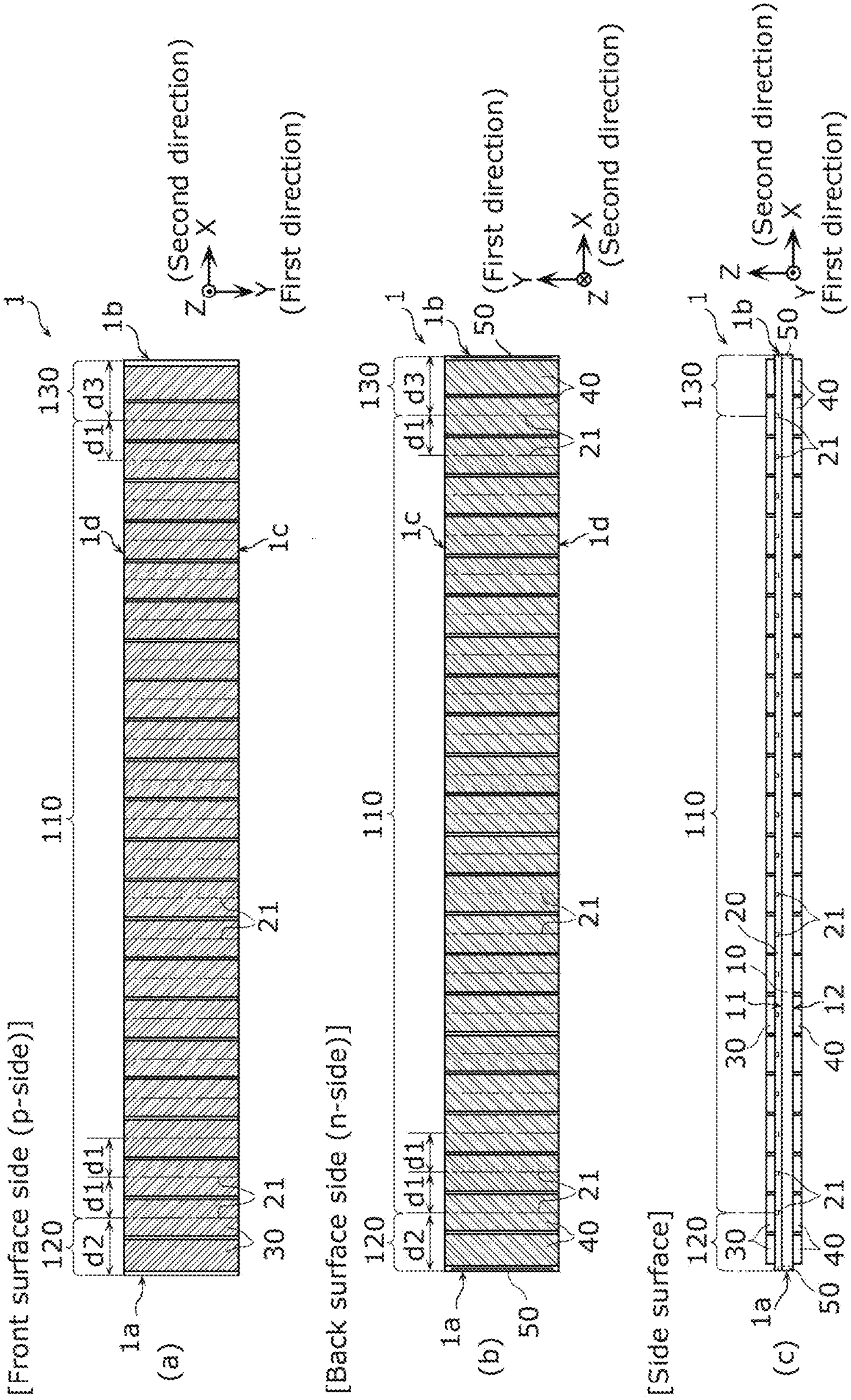
FIG. 1 is a diagram illustrating a configuration of a semiconductor laser element according to an embodiment.

Hereinafter, an embodiment of the present disclosure will be described with reference to the drawings. Note that the embodiment described below illustrates a specific example of the present disclosure. Thus, the numerical values, shapes, materials, constituent elements, the arrangement and connection of the constituent elements, steps (processes), the processing order of the steps, etc., illustrated in the following embodiment are mere examples, and are not intended to limit the present disclosure.

Note also that the drawings are represented schematically and are not necessarily precise illustrations. Thus, the scales of the drawings, for example, are not necessarily precise. In the drawings, essentially the same constituent elements are given the same reference signs, and duplicate descriptions thereof are omitted or simplified.

In the present specification and the drawings, the X axis, Y axis, and Z axis represent the three axes of a three-dimensional orthogonal coordinate system. In the present embodiment, the Z axis direction represents the vertical direction, and the direction perpendicular to the Z axis (direction parallel to the XY plane) represents the horizontal direction. The X axis and Y axis are orthogonal to each other, and are both orthogonal to the Z axis. In the present embodiment, the Y axis direction is a first direction, and the X axis direction is a second direction. The Y axis direction, which is the first direction, and the X axis direction, which is the second direction, are in-plane directions of substrate 10. That is to say, the Y axis direction, which is the first direction, and the X axis direction, which is the second direction, are parallel to first main surface 11 and second main surface 12 of substrate 10. Also, the direction in which waveguides 21 of semiconductor laser element 1 extend (the direction of the laser resonator length) is the Y axis direction. Note that the directions of arrows of the X axis, Y axis, and Z axis are their respective positive directions.

Embodiment

[Configuration of Semiconductor Laser Element]

Figure 2:
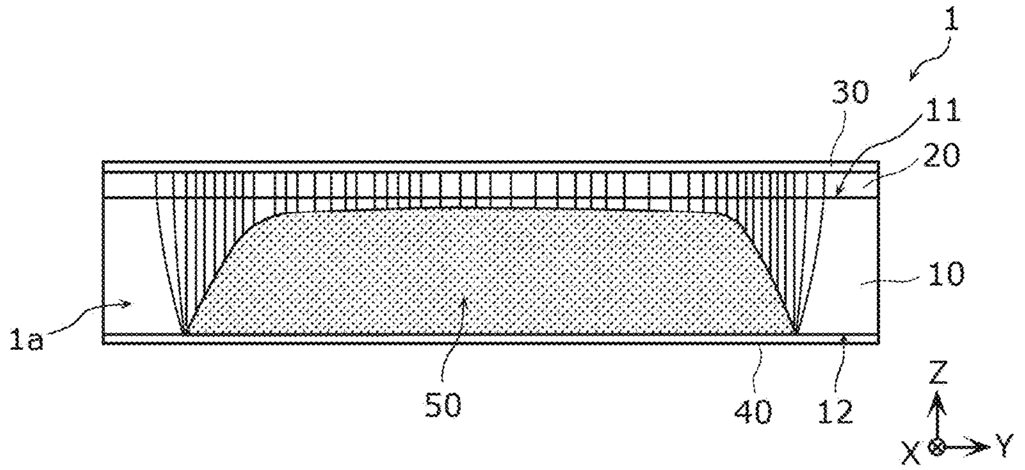
FIG. 2 is a side view of the semiconductor laser element according to the embodiment.

First, a configuration of semiconductor laser element 1 manufactured by a method of manufacturing semiconductor laser element 1 according to the present embodiment will be described with reference to FIG. 1 and FIG. 2. FIG. 1 is a diagram illustrating a configuration of semiconductor laser element 1 according to the embodiment. In FIG. 1, part (a) illustrates a top view of semiconductor laser element 1, part (b) illustrates a back view of semiconductor laser element 1, and part (c) illustrates a front view of semiconductor laser element 1. FIG. 2 illustrates a side view of semiconductor laser element 1.

Note that in FIG. 1, for easier recognition of the regions in which p-side electrodes 30 and n-side electrodes 40 are formed, p-side electrodes 30 and n-side electrodes 40 are hatched for convenience. Also, in FIG. 1, the center lines of waveguides 21 are illustrated with dash-dot-dash lines to show the positions of waveguides 21. Note that these apply to the subsequent drawings as well. In FIG. 2, for easier recognition of the region in which stepped portion 50 is formed, stepped portion 50 is dot-hatched for convenience.

Semiconductor laser element 1 according to the present embodiment is a semiconductor laser having a multi-emitter structure in which a plurality of emitters are integrated in a single element. Semiconductor laser element 1 emits a plurality of laser beams. Specifically, semiconductor laser element 1 is a nitride-based semiconductor laser made of a nitride-based semiconductor material, and emits, for example, blue laser beams.

As illustrated in FIG. 1 and FIG. 2, semiconductor laser element 1 is a laser bar that is elongated in the X axis direction, and includes substrate 10, nitride-based semiconductor laser stacking structure 20, p-side electrodes 30, and n-side electrodes 40.

Substrate 10 includes first main surface 11 and second main surface 12. Second main surface 12 is a surface on an opposite side relative to first main surface 11, and faces away from first main surface 11. In the present embodiment, first main surface 11 is the p-side surface, which is the front surface, and second main surface 12 is the n-side surface, which is the back surface.

For example, a semiconductor substrate such as a nitride semiconductor substrate is used as substrate 10. In the present embodiment, a hexagonal n-type GaN substrate is used as substrate 10.

Nitride-based semiconductor laser stacking structure 20 is a nitride semiconductor layer stacking body in which a plurality of nitride semiconductor layers each made of a nitride-based semiconductor material are stacked. Nitride-based semiconductor laser stacking structure 20 is formed above first main surface 11 of substrate 10. For example, nitride-based semiconductor laser stacking structure 20 has a configuration formed by sequentially stacking, on first main surface 11 of substrate 10, an n-type cladding layer made of n-type AlGaN, an active layer made of undoped InGaN, a p-type cladding layer made of p-type AlGaN, and a p-type contact layer made of p-type GaN.

Note that, in addition to these nitride semiconductor layers, nitride-based semiconductor laser stacking structure 20 may include other nitride semiconductor layers such as an optical guide layer and an overflow inhibition layer. Also, an insulating film having openings at positions corresponding to waveguides 21 may be formed on the surface of nitride-based semiconductor laser stacking structure 20.

Nitride-based semiconductor laser stacking structure 20 includes a plurality of waveguides 21 each extending in the Y axis direction (the first direction parallel to first main surface 11) in the plane of substrate 10. The plurality of waveguides 21 are spaced apart in the X axis direction (the direction orthogonal to the first direction and parallel to first main surface 11). Specifically, the plurality of waveguides 21 are parallel to each other and formed at a predetermined pitch in the X axis direction.

Each of the plurality of waveguides 21 functions as a current injection region and an optical waveguide in semiconductor laser element 1. The plurality of waveguides 21 correspond one-to-one with a plurality of emitters that emit laser beams. The plurality of waveguides 21 are formed in, for example, the p-type cladding layer of nitride-based semiconductor laser stacking structure 20. As an example, the plurality of waveguides 21 have a ridge stripe structure and are formed as a plurality of ridge portions in the p-type cladding layer. In this case, the p-type contact layer may be a plurality of semiconductor layers formed individually on each of the plurality of ridge portions, or may be a single semiconductor layer formed continuously to cover the plurality of ridge portions.

P-side electrodes 30 are formed on nitride-based semiconductor laser stacking structure 20. P-side electrodes 30 each include, for example, Pd, Pt, and Au. P-side electrodes 30 are formed on, for example, the p-type contact layer of nitride-based semiconductor laser stacking structure 20. As illustrated in part (a) of FIG. 1, in the present embodiment, a plurality of p-side electrodes 30 are formed to correspond one-to-one with the plurality of waveguides 21 (the ridge portions). In other words, p-side electrodes 30 are formed as separate electrodes. Note that p-side electrodes 30 need not be a plurality of separate electrodes. For example, p-side electrodes 30 may be a single electrode common to the plurality of waveguides 21.

N-side electrodes 40 are formed on second main surface 12 of substrate 10. N-side electrodes 40 each include, for example, Ti, Pt, and Au. As illustrated in part (b) of FIG. 1, in the present embodiment, a plurality of n-side electrodes 40 are formed to correspond one-to-one with the plurality of waveguides 21 (the ridge portions). In other words, n-side electrodes 40 are separate electrodes. Note that n-side electrodes 40 need not be a plurality of separate electrodes. For example, n-side electrodes 40 may be a single electrode common to the plurality of waveguides 21.

As illustrated in parts (a) through (c) of FIG. 1, semiconductor laser element 1 includes first side surface 1*a*, second side surface 1*b*, third side surface 1*c*, and fourth side surface 1*d*.

First side surface 1*a* is one end surface in the long-side direction of semiconductor laser element 1, and second side surface 1*b* is the other end surface in the long-side direction of semiconductor laser element 1. In other words, second side surface 1*b* is a surface on an opposite side relative to first side surface 1*a*, and faces away from first side surface 1*a*. The long-side direction of semiconductor laser element 1 is the X axis direction that is orthogonal to the long-side direction of waveguides 21.

In the present embodiment, first side surface 1*a* and second side surface 1*b* are surfaces orthogonal to first main surface 11 of substrate 10 and parallel to the Y axis direction (the first direction). Specifically, first side surface 1*a* and second side surface 1*b* are surfaces parallel to the YZ plane.

Third side surface 1*c* is one end surface in the short-side direction of semiconductor laser element 1, and fourth side surface 1*d* is the other end surface in the short-side direction of semiconductor laser element 1. In other words, fourth side surface 1*d* is a surface on an opposite side relative to third side surface 1*c*, and faces away from third side surface 1*c*. The short-side direction of semiconductor laser element 1 is the Y axis direction that is parallel to waveguides 21.

In the present embodiment, third side surface 1*c* and fourth side surface 1*d* are surfaces orthogonal to first main surface 11 of substrate 10 and orthogonal to the Y axis direction (the first direction). In other words, third side surface 1*c* and fourth side surface 1*d* are surfaces parallel to the X axis direction (the second direction). Specifically, third side surface 1*c* and fourth side surface 1*d* are surfaces parallel to the XZ plane and perpendicular to first side surface 1*a* and second side surface 1*b*.

In the present embodiment, third side surface 1*c* and fourth side surface 1*d* are resonator end surfaces of semiconductor laser element 1. Specifically, third side surface 1*c* is the front end surface of semiconductor laser element 1. In other words, the laser beams are emitted from third side surface 1*c*. Fourth side surface 1*d* is the rear end surface of semiconductor laser element 1. Although not illustrated in the diagram, third side surface 1*c* and fourth side surface 1*d* are coated with an end surface coating film as a reflective film.

Although the details will be described later, first side surface 1*a*, second side surface 1*b*, third side surface 1*c*, and fourth side surface 1*d* are division surfaces at the time of producing semiconductor laser element 1 from a wafer. Specifically, first side surface 1*a* and second side surface 1*b* are division surfaces at the time of division in the Y axis direction, and third side surface 1*c* and fourth side surface 1*d* are division surfaces at the time of division in the X axis direction. Note that third side surface 1*c* and fourth side surface 1*d* are cleavage surfaces formed by cleavage. Therefore, the flatness of third side surface 1*c* is greater than the flatness of each of first side surface 1*a* and second side surface 1*b*. Likewise, the flatness of fourth side surface 1*d* is greater than the flatness of each of first side surface 1*a* and second side surface 1*b*. This allows light to resonate efficiently in waveguides 21 between third side surface 1*c* and fourth side surface 1*d*, and laser beams can be thereby obtained.

When semiconductor laser element 1 is viewed in the X axis direction, stepped portion 50 which is recessed inwardly from a surface of semiconductor laser element 1 on the second main surface 12 side is formed on first side surface 1*a*. Likewise, stepped portion 50 which is recessed inwardly from the surface of semiconductor laser element 1 on the second main surface 12 side is formed on second side surface 1*b* as well. In other words, stepped portion 50 is formed to be depressed into the positive direction of the Z axis direction from the surface of semiconductor laser element 1 on the second main surface 12 side, that is, the back surface of semiconductor laser element 1.

As illustrated in FIG. 2, in the present embodiment, stepped portion 50 is formed to remain within the thickness of substrate 10 from the surface on the second main surface 12 side. Stepped portion 50 does not reach nitride-based semiconductor laser stacking structure 20. The depth of stepped portion 50 is set to a value that does not cause an electric short circuit of a pn junction formed in nitride-based semiconductor laser stacking structure 20. Note that as illustrated with the dot hatching in FIG. 2, stepped portion 50 is formed in a substantially trapezoidal shape in a side view in the X axis direction, but the shape of stepped portion 50 is not limited to this.

As illustrated in part (b) of FIG. 1, stepped portion 50 extends in the Y axis direction when semiconductor laser element 1 is viewed in the Z axis direction. Stepped portion 50, however, does not reach third side surface 1*c* or fourth side surface 1*d*. In other words, one end of stepped portion 50 in the Y axis direction is set back from third side surface 1*c*, and the other end of stepped portion 50 in the Y axis direction is set back from fourth side surface 1*d*. Note that stepped portion 50 is part of division groove 6 used for dividing the semiconductor laser element, as will be described in detail later.

As illustrated in FIG. 1, semiconductor laser element 1 includes first region 110 which is a region in which the plurality of waveguides 21 are formed, second region 120 which is a region interposed between first region 110 and first side surface 1*a*, and third region 130 which is a region interposed between first region 110 and second side surface 1*b*.

In the present embodiment, in second region 120 and third region 130, p-side electrodes 30 and n-side electrodes 40 are formed but waveguides 21 are not formed. Therefore, second region 120 and third region 130 are regions that do not function as semiconductor lasers, and the laser beams are not emitted from second region 120 or third region 130.

Given that: first distance d1 is the shortest distance among distances between two adjacent waveguides 21 included in the plurality of waveguides 21 of semiconductor laser element 1; second distance d2 is the distance between first side surface 1*a* and waveguide 21 located closest to first side surface 1*a* among the plurality of waveguides 21 of semiconductor laser element 1; and third distance d3 is the distance between second side surface 1*b* and waveguide 21 located closest to second side surface 1*b* among the plurality of waveguides 21 of semiconductor laser element 1, second distance d2 and third distance d3 are greater than first distance d1.

In the present embodiment, first distance d1 is in first region 110. Specifically, all waveguides 21 in first region 110 are formed at the same pitch. That is to say, all waveguides 21 in first region 110 are formed at equal distances, and the distances between two adjacent waveguides 21 in first region 110 are all the same at first distance d1.

Second distance d2 is the width of second region 120 in the X axis direction, and third distance d3 is the width of third region 130 in the X axis direction. In the present embodiment, second distance d2 and third distance d3 are the same, but are not limited to being the same.

As an example, the width of semiconductor laser element 1 (length in the X axis direction) is 9200 μm, and the length of semiconductor laser element 1 in the resonator length direction (length in the Y axis direction) is 1200 μm. In this case, first distance d1 is d1=400 μm, and second distance d2 and third distance d3 are d2=d3=600 μm. In other words, second region 120 and third region 130 each having a width of 600 μm are located at the two end portions of semiconductor laser element 1 in the long-side direction as regions in which waveguides 21 are not present. Note that in first region 110, there are twenty-one waveguides 21 formed at distances of 400 μm, and each waveguide 21 has a width of 30 μm centered on the dash-dot-dash line.

[Method of Manufacturing Semiconductor Laser Element]

Next, a method of manufacturing semiconductor laser element 1 according to the embodiment will be described with reference to FIG. 1, using FIG. 3 through FIG. 11. FIG. 3 through FIG. 11 are diagrams for describing the method of manufacturing semiconductor laser element 1 according to the embodiment. Note that in FIG. 4, FIG, 5, FIG. 8, and FIG. 10, for easier recognition of the region in which debris is formed, debris is dot-hatched for convenience.

The method of manufacturing semiconductor laser element 1 according to the present embodiment is a method of manufacturing semiconductor laser element 1 that includes a plurality of waveguides 21.

Figure 3:
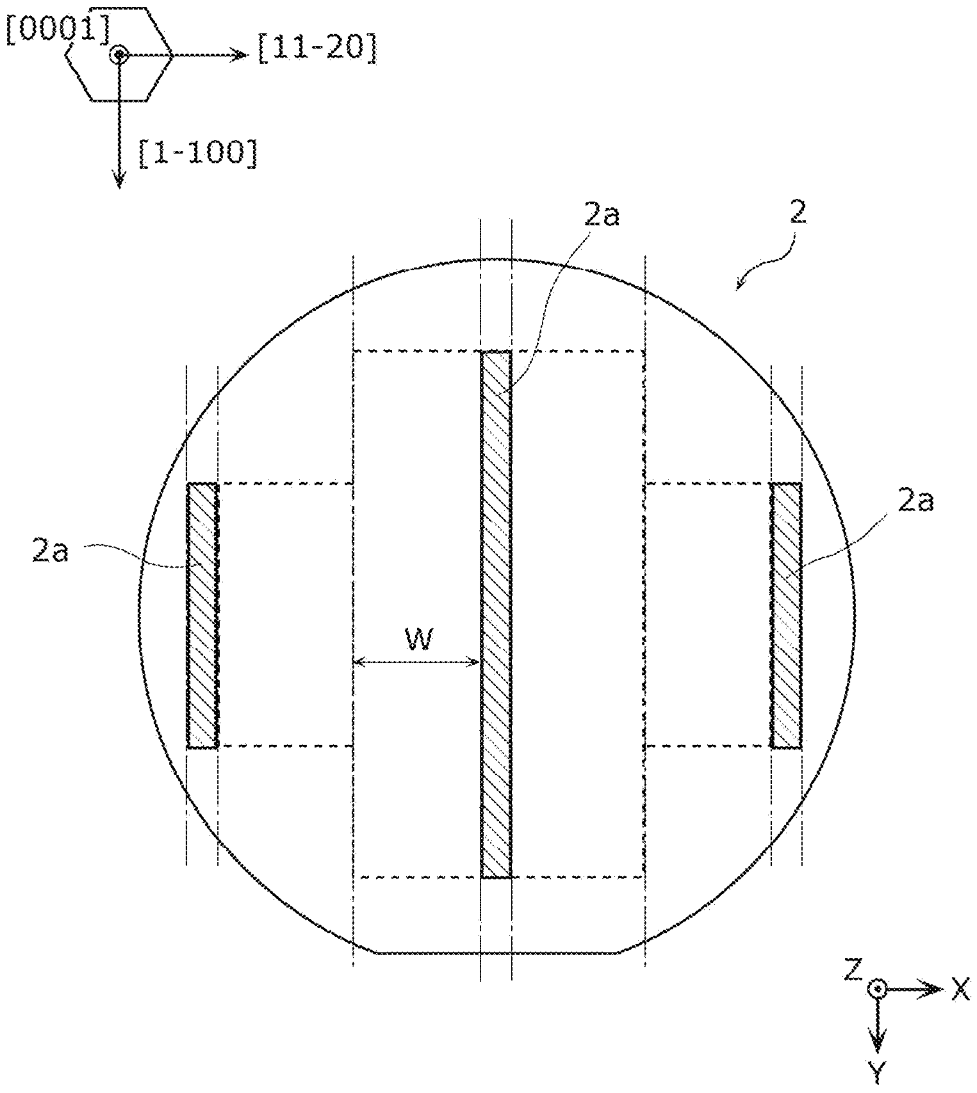
FIG. 3 is a diagram for describing a process of producing a semiconductor stacking substrate in a method of manufacturing a semiconductor laser element according to the embodiment.

First, as illustrated in FIG. 3, semiconductor stacking substrate 2 in which semiconductor layers are stacked is produced. Semiconductor stacking substrate 2 is a substrate in which: nitride-based semiconductor laser stacking structure 20 including the plurality of waveguides 21; p-side electrodes 30; and n-side electrodes 40 are formed on substrate 10 serving as a wafer.

For example, a hexagonal n-type GaN substrate is used as substrate 10. Therefore, in the present embodiment, as illustrated in FIG. 3, the direction [11-20] of the GaN substrate is the X axis direction, the direction [1-100] of the GaN substrate is the Y axis direction, and the direction [0001] of the GaN substrate is the Z axis direction.

To produce semiconductor stacking substrate 2, first, a wafer of a 2-inch n-type GaN substrate is prepared as substrate 10, and next, a plurality of nitride semiconductor layers are epitaxially grown sequentially on the entire surface of first main surface 11 of substrate 10. For example, metal organic chemical vapor deposition (MOCVD) is used to sequentially form, on first main surface 11 of substrate 10, an n-type cladding layer made of n-type AlGaN, an active layer made of undoped InGaN, a p-type cladding layer made of p-type AlGaN, and a p-type contact layer made of p-type GaN. Thereafter, the plurality of nitride semiconductor layers stacked are subjected to photolithography and etching to form ridge stripes that serve as the plurality of waveguides 21. Note that each of the plurality of waveguides 21 is formed in the direction [1-100]. As a result, nitride-based semiconductor laser stacking structure 20 that includes the plurality of waveguides 21 can be formed on substrate 10. Thereafter, an insulating film is formed to partially cover nitride-based semiconductor laser stacking structure 20, and furthermore, p-side electrodes 30 are formed on the ridge stripes of nitride-based semiconductor laser stacking structure 20. Next, substrate 10 is thinned by grinding and polishing the back surface of substrate 10. As an example, the back surface of substrate 10 is polished until semiconductor stacking substrate 2 that is 400 μm in thickness becomes 85 μm in thickness. Thereafter, n-side electrodes 40 are formed on second main surface 12 which is the back surface of thinned substrate 10. As a result, semiconductor stacking substrate 2 can be produced.

Next, as a wafer shaping process, semiconductor stacking substrate 2 illustrated in FIG. 3 is divided into a plurality of pieces (a first division process (also referred to as "first dividing")). Specifically, by dividing semiconductor stacking substrate 2 along division lines indicated by the dash-dot-dash lines in FIG. 3, regions for producing semiconductor laser elements 1 (laser bars) are cut out in the form of strips.

Figure 4:
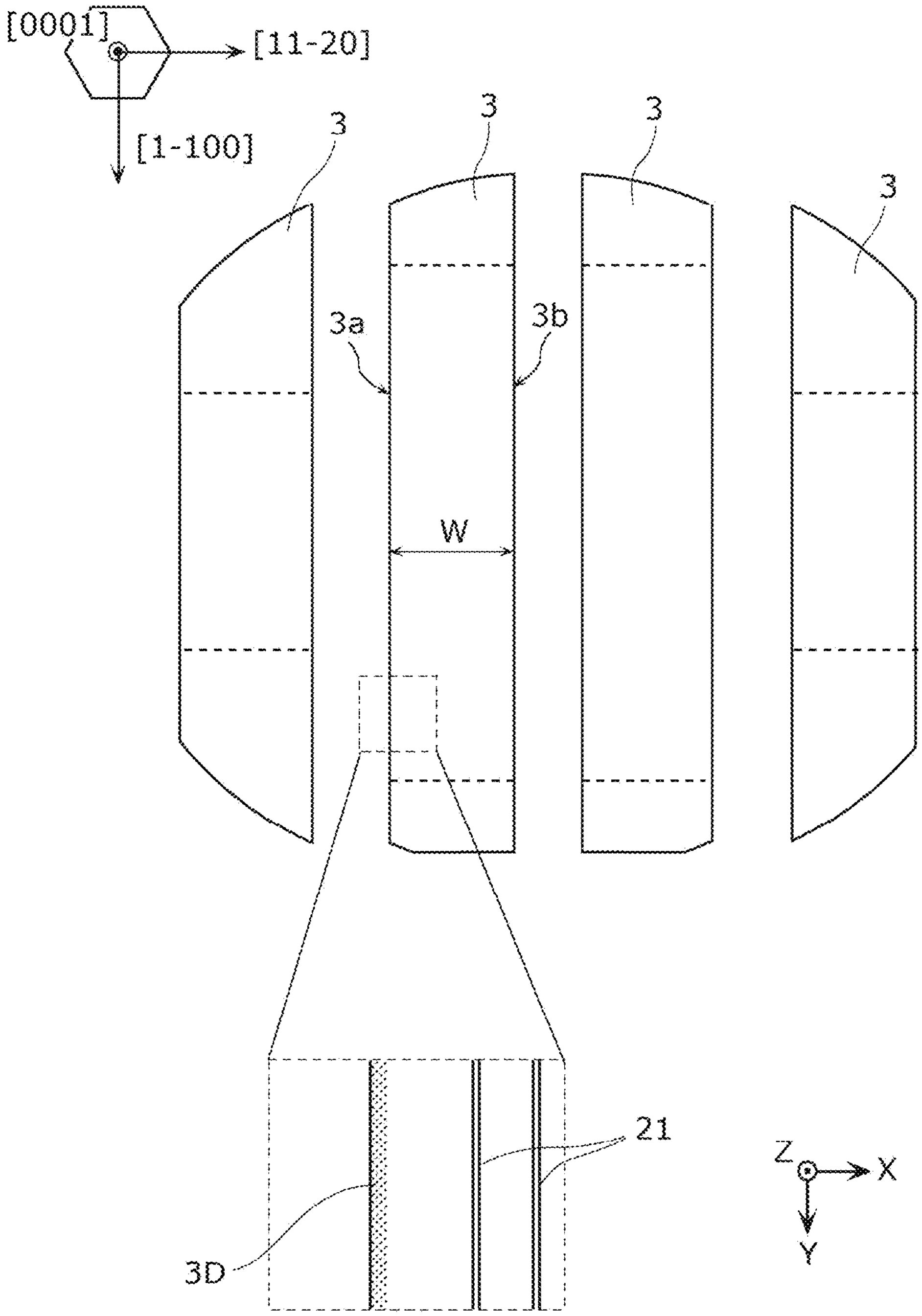
FIG. 4 is a diagram for describing a process (a first division process) of producing divided substrates by dividing the semiconductor stacking substrate in the method of manufacturing a semiconductor laser element according to the embodiment.

In the present embodiment, four divided substrates 3 are produced as illustrated in FIG. 4 by cutting semiconductor stacking substrate 2 along eight division lines illustrated in FIG. 3. In this case, in the present embodiment, semiconductor stacking substrate 2 is divided into four pieces by performing laser scribing on the surface (the front surface) of semiconductor stacking substrate 2 on the first main surface 11 side of substrate 10 and cutting semiconductor stacking substrate 2 in the Y axis direction.

Note that the regions surrounded by dashed lines in FIG. 3 and FIG. 4 are regions valid for extracting semiconductor laser elements 1, and are regions for producing semiconductor laser elements 1. As an example, width W of each region (laser bar region) for producing semiconductor laser elements 1 is 10000 μm. Accordingly, width W of each of four divided substrates 3 in the X axis direction is 10000 μm. Hatched regions illustrated in FIG. 3 are process control monitor (PCM) regions 2*a* which are not used as semiconductor laser elements 1. The width of each PCM region 2*a* is 1200 μm, for example.

When the thickness of semiconductor stacking substrate 2 is 85 μm, the depth of scribed grooves formed by laser scribing is approximately 50 μm from the surface of semiconductor stacking substrate 2 on the first main surface 11 side, and the width of the scribed grooves in top view is approximately 5 μm. In this case, as illustrated in the enlarged view in FIG. 4, forming the scribed grooves on semiconductor stacking substrate 2 for cutting semiconductor stacking substrate 2 causes deposition of debris 3D having a width of approximately 30 μm on both lateral sides of each scribed groove. Debris 3D is processing waste of semiconductor stacking substrate 2 generated when forming the scribed grooves on semiconductor stacking substrate 2 by laser scribing. In the present embodiment, debris 3D is deposited on the surface of semiconductor stacking substrate 2 on the p-side electrode side, that is, the front surface of semiconductor stacking substrate 2. Note that the scribed grooves formed in the first division process function as grooves for division that are used for dividing semiconductor stacking substrate 2 into a plurality of divided substrates 3.

In such a manner, in the first division process, substrate 10 on which nitride-based semiconductor laser stacking structure 20 including a plurality of waveguides 21 spaced apart in the X axis direction and extending in the Y axis direction are formed is divided in the Y axis direction, to produce the plurality of divided substrates 3 each including a plurality of waveguides 21 spaced apart in the X axis direction.

Note that the laser scribing in the first division process is performed on the surface (the front surface) of semiconductor stacking substrate 2 on the first main surface 11 side of substrate 10, but the present disclosure is not limited to this. That is to say, the laser scribing in the first division process may be performed on the surface (the back surface) of semiconductor stacking substrate 2 on the second main surface 12 side of substrate 10. In this case, however, since debris 3D is deposited on the surface of semiconductor stacking substrate 2 on the second main surface 12 side of substrate 10 (that is, the surface on the n-side electrode 40 side), debris 3D may become an obstacle in the next process (a cleavage process). Therefore, it is better to perform the laser scribing of the first division process on the surface (the front surface) of semiconductor stacking substrate 2 on the first main surface 11 side of substrate 10.

Next, one divided substrate 3 included in the plurality of divided substrates 3 produced by the first division process described above is cleaved in the X axis direction to produce a plurality of semiconductor laser elements 5 each including a plurality of waveguides 21 (the cleavage process (also referred to as "cleaving")).

In the present embodiment, the cleavage process includes a first cleavage process of forming, on divided substrate 3, cleavage lead-in grooves 4 extending in the X axis direction (the first cleavage process is also referred to as "forming a cleavage lead-in groove") and a second cleavage process of cleaving divided substrates 3 in the long-side direction of cleavage lead-in grooves 4 (the second cleavage process is also referred to as "cleaving the one divided substrate"). The long-side direction of cleavage lead-in grooves 4 is the X axis direction that is orthogonal to waveguides 21.

The first cleavage process is a pre-process for cleaving divided substrate 3, and is a process of forming cleavage lead-in grooves 4 as the starting points of cleavage. That is to say, cleavage lead-in grooves 4 are guide grooves for when cleaving and dividing divided substrate 3, and function as grooves for division that are used for dividing divided substrate 3 into a plurality of pieces.

Figure 5:
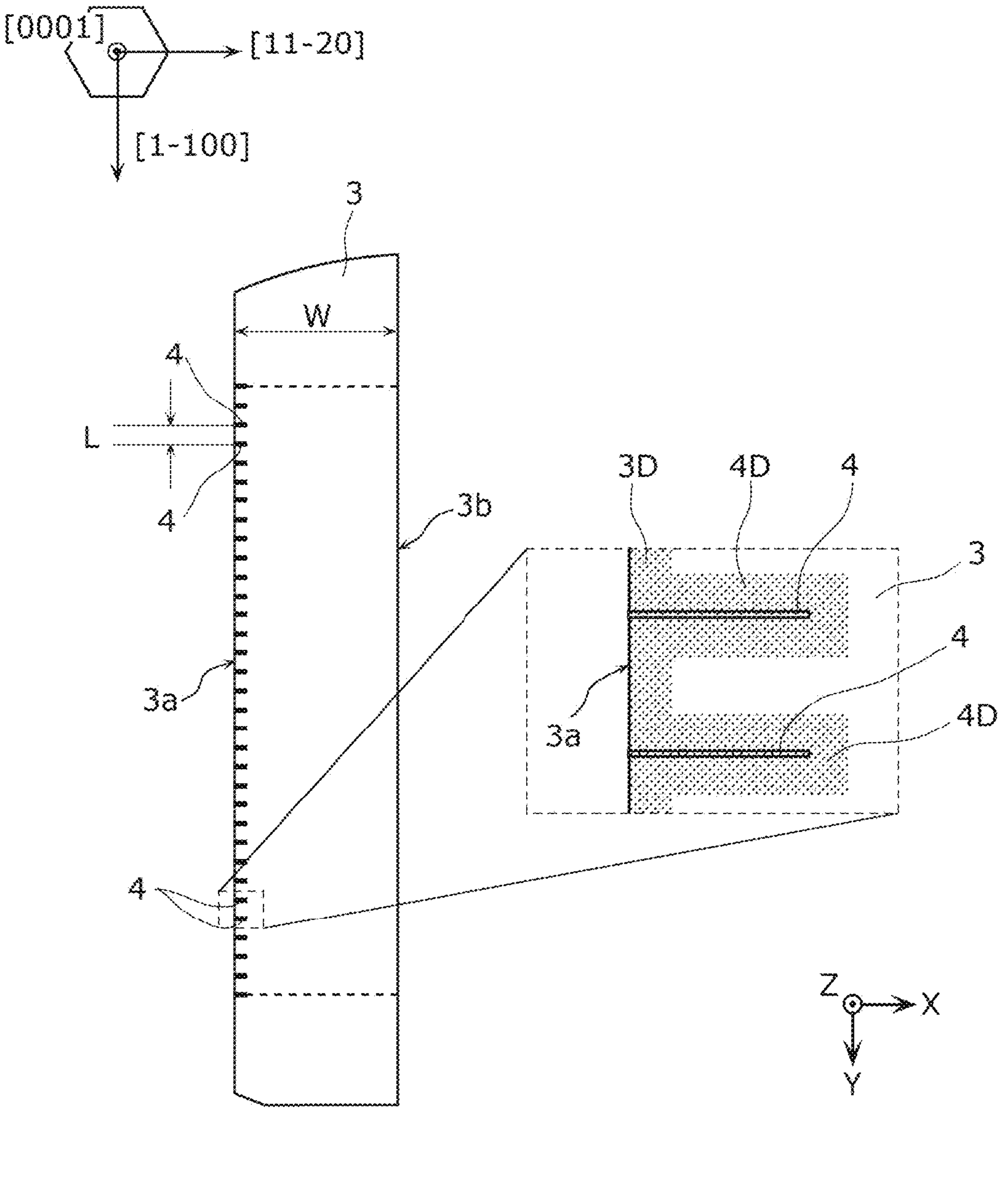
FIG. 5 is a diagram for describing a process (a first cleavage process) of forming cleavage lead-in grooves on a divided substrate in the method of manufacturing a semiconductor laser element according to the embodiment.

Specifically, in the first cleavage process, as illustrated in FIG. 5, cleavage lead-in grooves 4 are formed in the vicinity of first end surface 3*a* which is one end surface of divided substrate 3. More specifically, cleavage lead-in grooves 4 are formed by cutting out an end portion of divided substrate 3 from first end surface 3*a* of divided substrate 3 toward second end surface 3*b* which is the other end surface of divided substrate 3. In the present embodiment, laser scribing is performed to form a plurality of cleavage lead-in grooves 4 on divided substrate 3 in the direction [11-20]. Thus, cleavage lead-in grooves 4 are laser-scribed grooves formed by laser scribing. The plurality of cleavage lead-in grooves 4 are formed at equal distances in the Y axis direction. As an example, distance L between two adjacent cleavage lead-in grooves 4 is 1200 μm. This distance L between two adjacent cleavage lead-in grooves 4 ultimately matches the laser resonator length of semiconductor laser element 1. Note that the depth of each cleavage lead-in groove 4 formed by laser scribing is approximately 40 μm from the surface of divided substrate 3 on the first main surface 11 side, and in top view, the width of each cleavage lead-in groove 4 is approximately 5 μm and the length of each cleavage lead-in groove 4 is approximately 350 μm.

In the present embodiment, the laser scribing is performed on the surface of divided substrate 3 on the first main surface 11 side of substrate 10 (that is, the front surface on the p-side electrode 30 side). This is because cleavage lead-in grooves 4 need to be accurately aligned with the shape of nitride-based semiconductor laser stacking structure 20 (that is, a mask pattern).

In this case, as illustrated in the enlarged view in FIG. 5, the formation of cleavage lead-in grooves 4 on divided substrate 3 causes deposition of debris 4D having a width of approximately 30 μm on both lateral sides of each cleavage lead-in groove 4 on the front surface of divided substrate 3. Debris 4D is processing waste of divided substrate 3 generated when forming cleavage lead-in grooves 4 on divided substrate 3 by laser scribing.

Note that cleavage lead-in grooves 4 formed by the first cleavage process are formed in positions corresponding to second region 120 of semiconductor laser element 1 illustrated in FIG. 1, and do not reach waveguides 21 located in first region 110.

After the first cleavage process, the second cleavage process is performed. The second cleavage process is a process for cleaving divided substrate 3, and is a process of dividing divided substrate 3 by cleavage with cleavage lead-in grooves 4 used as the starting points. Specifically, as illustrated in FIG. 6, by cleaving and splitting divided substrate 3 sequentially along each of the plurality of cleavage lead-in grooves 4 formed on divided substrate 3, a plurality of semiconductor laser elements 5 each including a plurality of waveguides 21 are produced.

Specifically, in the second cleavage process, a Teflon (registered trademark) blade is pressed into a portion which is on the surface (that is, the back surface) of divided substrate 3 on the second main surface 12 side of substrate 10 and which corresponds to a position opposite cleavage lead-in groove 4. As a result, cleavage occurs from cleavage lead-in groove 4 as the starting point, causing divided substrate 3 to be naturally cut and divided in the direction [1-100] indicated by the dash-dot-dash lines in FIG. 6. Accordingly, semiconductor laser elements 5 each including a plurality of waveguides 21 can be produced. Semiconductor laser elements 5 produced in such a manner are bar-shaped laser element substrates.

Note that in the second cleaving process, if debris 3D generated by the laser scribing performed in the first division process is deposited on the back surface of divided substrate 3 (the surface on the n-side electrode 40 side), debris 3D will be an obstacle when pressing the blade. Therefore, as described above, in the first division process, the laser scribing is performed on the front surface of semiconductor stacking substrate 2 (the surface on the p-side electrode 30 side) so that debris 3D is deposited on the front surface of semiconductor stacking substrate 2.

Figure 6:
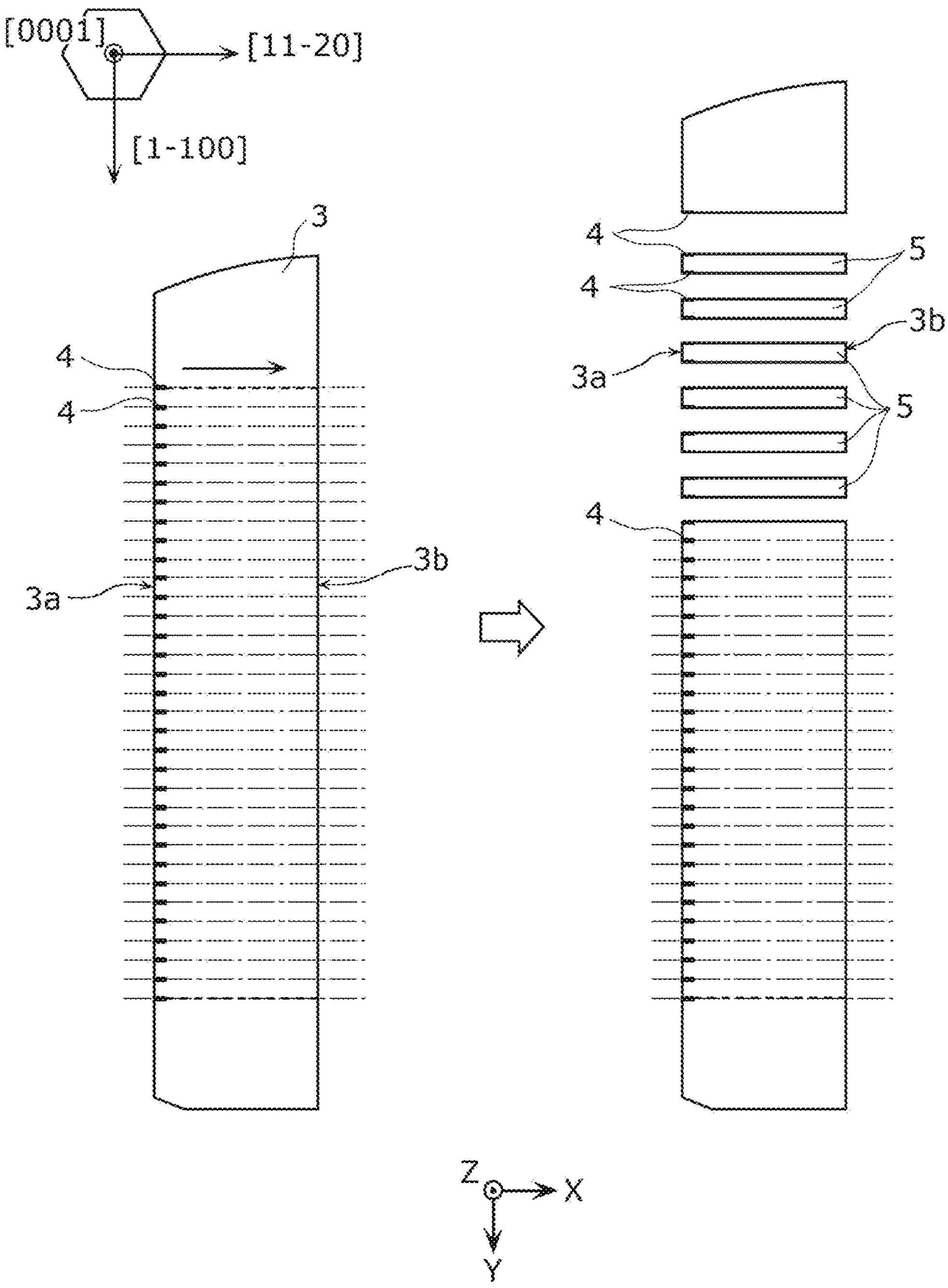
FIG. 6 is a diagram for describing a process (a second cleavage process) of dividing the divided substrate by cleavage in the method of manufacturing a semiconductor laser element according to the embodiment.
Figure 7A:
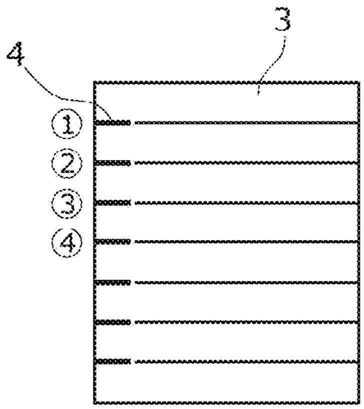
FIG. 7A is a diagram illustrating a first example of the order in which the divided substrate is cleaved for dividing the divided substrate.
Figure 7B:
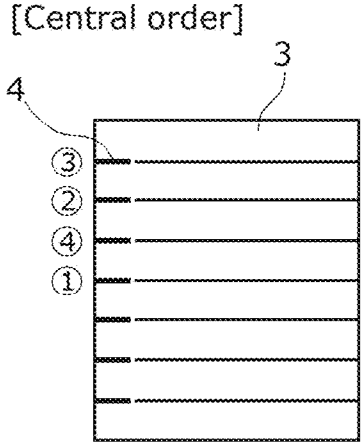
FIG. 7B is a diagram illustrating a second example of the order in which the divided substrate is cleaved for dividing the divided substrate.

When cleaving and dividing divided substrate 3 into a plurality of semiconductor laser elements 5, the order in which divided substrate 3 is cleaved may be a sequential order as illustrated in FIG. 6 and FIG. 7A, but it is favorable to cleave divided substrate 3 in a central order as illustrated in FIG. 7B. Cleavage of divided substrate 3 in the central order allows the mechanical force applied during cleavage to be distributed equally in the up and down directions, so divided substrate 3 can be cleaved well as a whole.

As described, the end portions, in the long-side direction, of semiconductor laser element 5 produced by the cleavage process (the first cleavage process and the second cleavage process) have debris 3D and 4D deposited thereon. Specifically, debris 3D and 4D are deposited on the surface of semiconductor laser element 5 on the first main surface 11 side of substrate 10. That is to say, debris 3D and 4D are deposited on the surface (the front surface) of semiconductor laser element 5 on the p-side electrode 30 side.

In view of this, after the cleavage process (the first cleavage process and the second cleavage process), semiconductor laser element 5 is divided to remove the portions of semiconductor laser element 5 where debris 3D and 4D are deposited (a second division process (also referred to as "second dividing")).

In the second division process, one semiconductor laser element 5 included in the plurality of semiconductor laser elements 5 produced by the cleavage process is divided in the Y axis direction to remove at least one of the end portions of semiconductor laser element 5 in the long-side direction.

Figure 8:
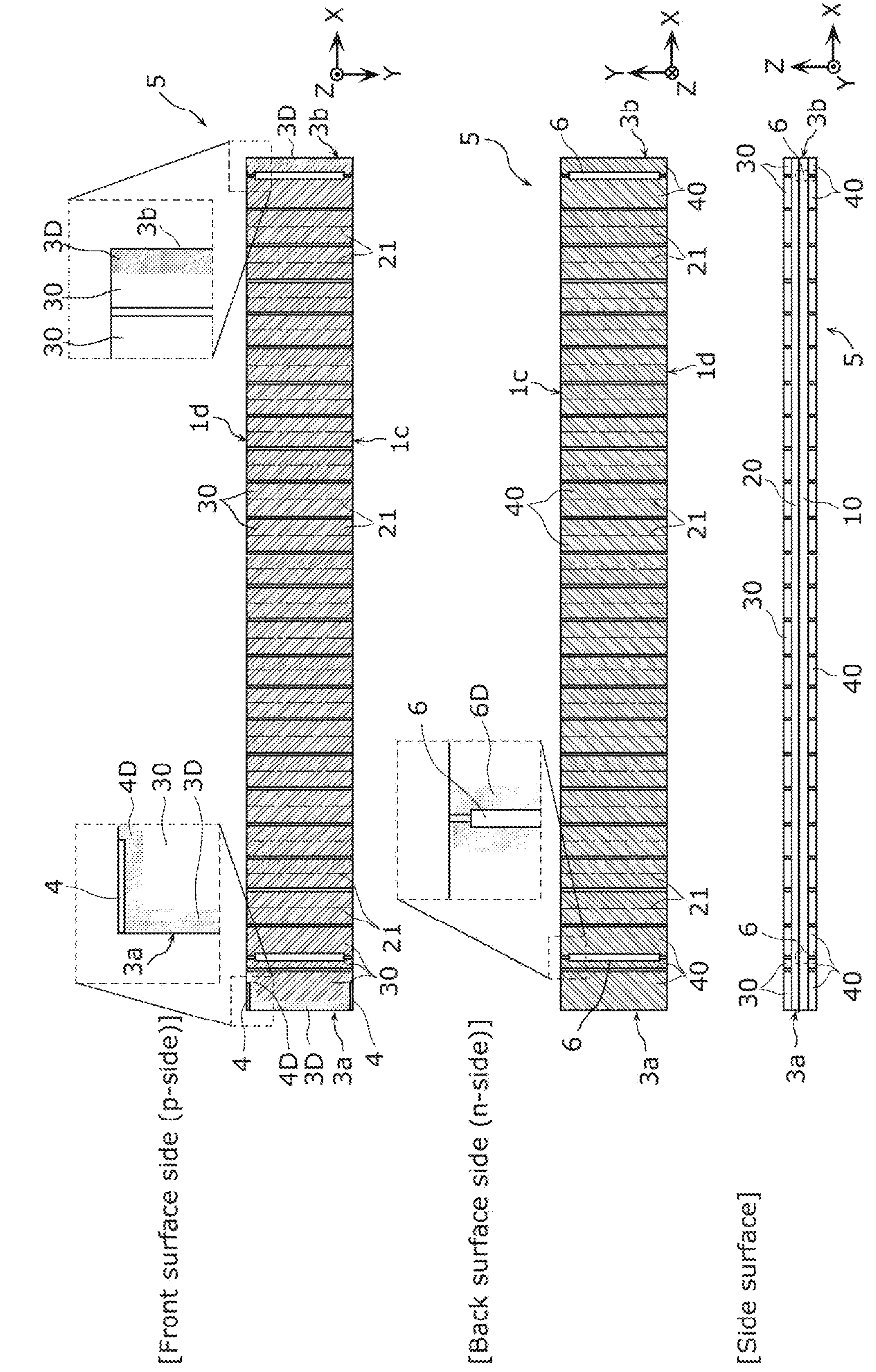
FIG. 8 is a diagram for describing a process of forming division grooves on a semiconductor laser element in the method of manufacturing a semiconductor laser element according to the embodiment.

In the present embodiment, as illustrated in FIG. 8, cleavage lead-in grooves 4 remain at an end portion of semiconductor laser element 5 located closer to first end surface 3*a* which is one end surface of semiconductor laser element 5 in the long-side direction, and debris 4D deposited during the formation of cleavage lead-in grooves 4 is present in the vicinity of cleavage lead-in grooves 4. In addition, the scratch of the laser scribing (the laser-scribed groove) formed in the first division process remains at the end portion of semiconductor laser element 5 on the first end surface 3*a* side, and debris 3D deposited due to the laser scribing is present in the vicinity of first end surface 3*a* of semiconductor laser element 5. As described, debris 3D and 4D, cleavage lead-in grooves 4, and the scratch of the laser scribing are present at the end portion of semiconductor laser element 5 on the first end surface 3*a* side. Therefore, in the second division process, the end portion of semiconductor laser element 5 on the first end surface 3*a* side is removed to remove debris 3D and 4D, cleavage lead-in grooves 4, and the scratch of the laser scribing.

As illustrated in FIG. 8, at an end portion of semiconductor laser element 5 located closer to second end surface 3*b* which is the other end surface of semiconductor laser element 5 in the long-side direction, cleavage lead-in groove 4 is not present but the scratch of the laser scribing formed in the first division process remains and debris 3D deposited due to the laser scribing is present. Therefore, in the second division process, the end portion of semiconductor laser element 5 on the second end surface 3*b* side is removed to remove debris 3D and the scratch of the laser scribing.

In such a manner, not only the end portion of semiconductor laser element 5 on the first end surface 3*a* side, but the end portion of semiconductor laser element 5 on the second end surface 3*b* side is also removed. In other words, each of the two ends of semiconductor laser element 5 in the long-side direction is removed.

Specifically, to remove the end portion of semiconductor laser element 5 on the first end surface 3*a* side and the end portion of semiconductor laser element 5 on the second end surface 3*b* side, first, by laser scribing, division grooves 6 are formed on the surface of semiconductor laser element 5 on the second main surface 12 side of substrate 10, as illustrated in FIG. 8 (a groove forming process (also referred to as "forming a division groove")). Division grooves 6 are grooves for division that are used for dividing semiconductor laser element 5.

In the groove forming process, division grooves 6 extending in the Y axis direction are formed on the surface (the back surface) of semiconductor laser element 5 on the second main surface 12 side of substrate 10. In the present embodiment, laser scribing is performed to form division grooves 6 on semiconductor laser element 5. Therefore, division grooves 6 are laser-scribed grooves formed by laser scribing.

Since division grooves 6 are formed by performing laser scribing on the back surface (the surface on the n-side electrode 40 side) of semiconductor laser element 5 in the above manner, even if debris 6D is generated by the laser scribing, debris 6D is deposited on the back surface of semiconductor laser element 5, and is not deposited on the front surface (the surface on the p-side electrode 30 side) of semiconductor laser element 5. In this case, as illustrated in the enlarged view in FIG. 8, the formation of division grooves 6 on semiconductor laser element 5 causes deposition of debris 6D having a width of approximately 30 μm on both lateral sides of division grooves 6 on the back side of semiconductor laser element 5. Debris 6D is processing waste of semiconductor laser element 5 generated when forming division grooves 6 on semiconductor laser element 5 by laser scribing. Debris 6D is deposited on the surfaces of n-side electrodes 40, for example.

In the present embodiment, division grooves 6 do not reach third side surface 1*c* or fourth side surface 1*d* formed on semiconductor laser element 5 by the second cleavage process described above. In other words, one end portion of each division groove 6 in the Y axis direction is set back from third side surface 1*c*, and the other end portion of each division groove 6 is set back from fourth side surface 1*d*. With this configuration, it is possible to inhibit the debris generated during the formation of division grooves 6 by laser scribing from attaching to third side surface 1*c* and fourth side surface 1*d* which are the resonator end surfaces of semiconductor laser element 5.

The depth of each division groove 6 formed by laser scribing is approximately 50 μm from the surface (the back surface) of semiconductor laser element 5 on the second main surface 12 side, and in top view, the width of each division groove 6 is approximately 5 μm and the length of each division groove 6 is approximately 1100 μm.

In the present embodiment, in order to remove each of the two end portions of semiconductor laser element 5 in the long-side direction, division groove 6 is formed at each of the end portion of semiconductor laser element 1 on the first end surface 3*a* side and the end portion of semiconductor laser element 1 on the second end surface 3*b* side. Specifically, division groove 6 at the end portion on the first end surface 3*a* side is formed at the position 600 μm away from first end surface 3*a*. Also, division groove 6 at the end portion on the second end surface 3*b* side is formed at the position 200 μm away from second end surface 3*b*.

Figure 9:
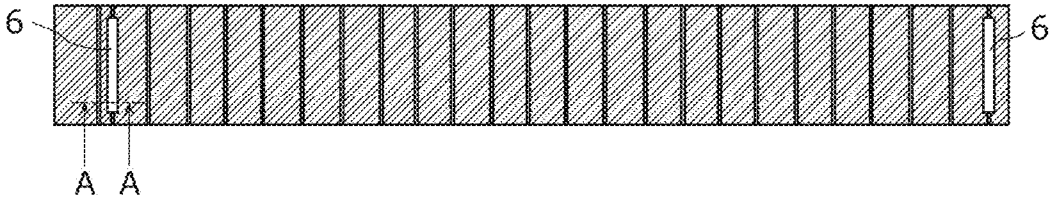
FIG. 9 is a diagram illustrating the semiconductor laser element on which division grooves have been formed and scanning electron microscope (SEM) images of a cross section of the semiconductor laser element at line A-A.
Figure 9:
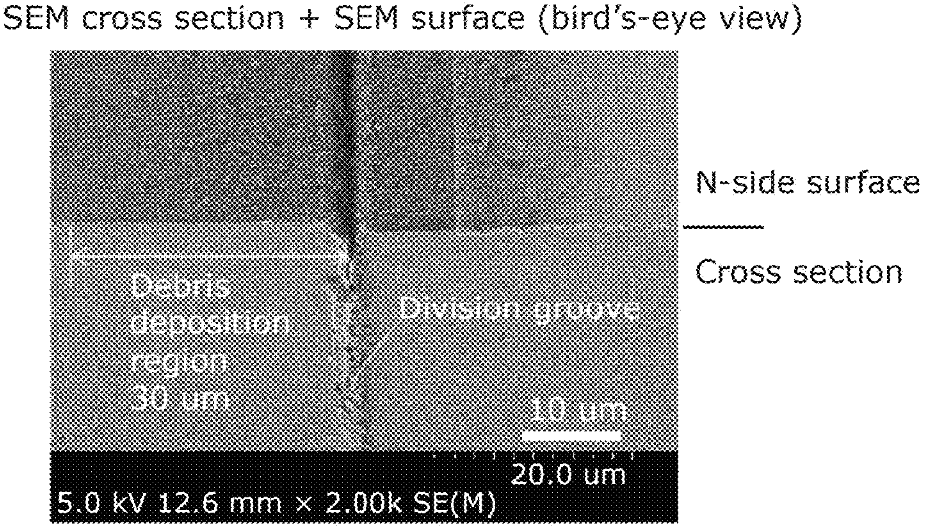
Figure 9:
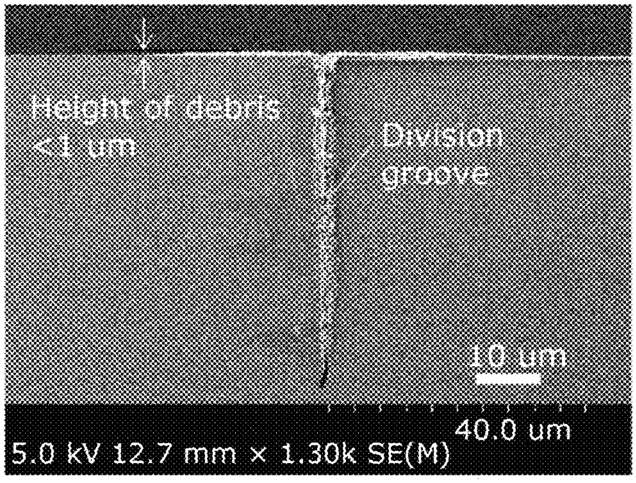

FIG. 9 illustrates scanning electron microscope (SEM) images captured after division grooves 6 are formed. FIG. 9 illustrates semiconductor laser element 5 on which division grooves 6 have been formed and SEM images of a cross section of semiconductor laser element 5 at line A-A. As illustrated in FIG. 9, it can be understood that the formation of division grooves 6 which are 50 μm in depth causes deposition of debris 6D having a height of 1 μm or less and a width of 30 μm in the vicinity of division grooves 6.

Next, after forming division grooves 6 on semiconductor laser element 5 by the groove forming process, semiconductor laser element 5 is divided along division grooves 6 to remove the portion including cleavage lead-in grooves 4.

Figure 10:
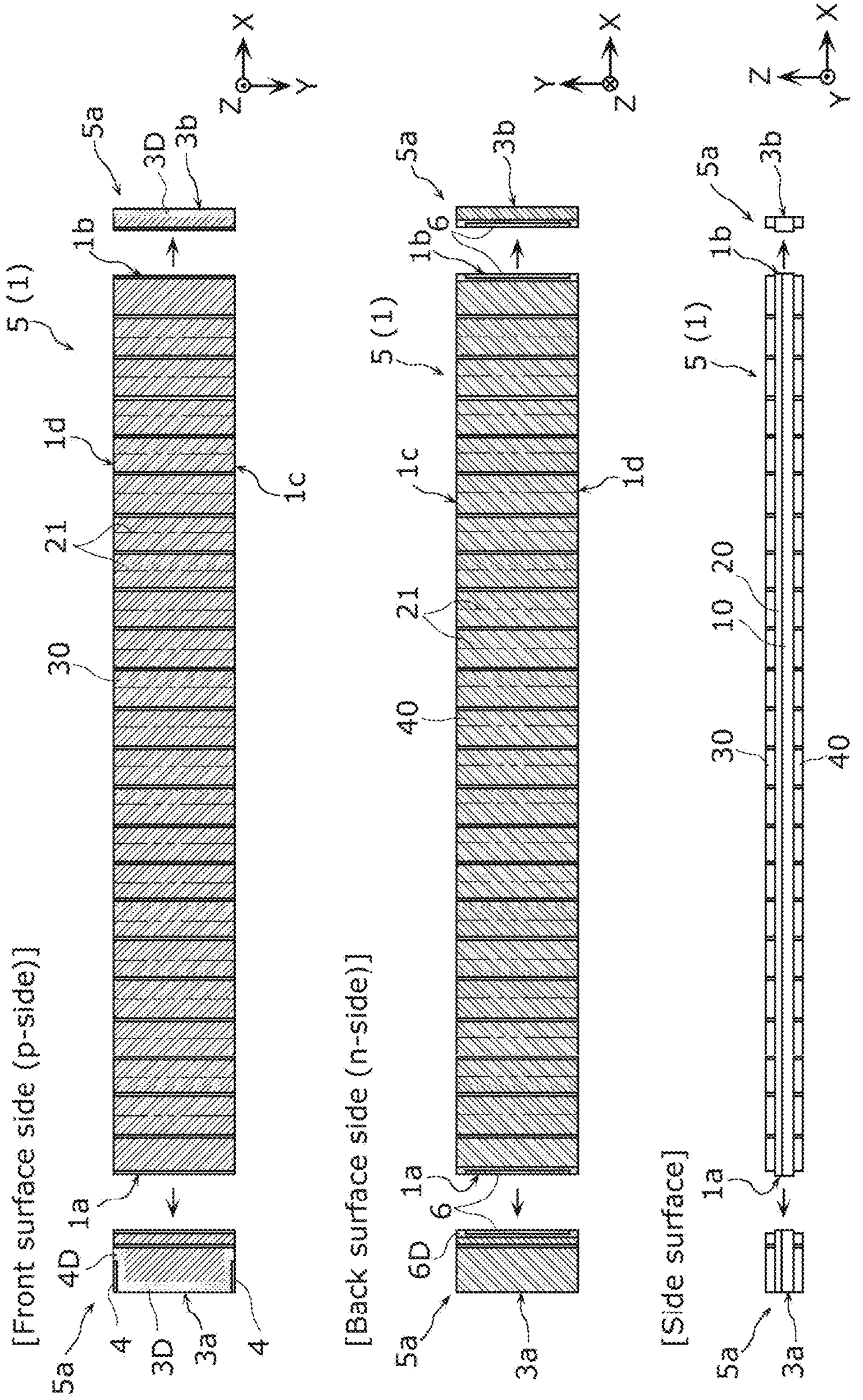
FIG. 10 is a diagram for describing a process (a second division process) of removing end portions of the semiconductor laser element in the method of manufacturing a semiconductor laser element according to the embodiment.

Specifically, a Teflon (registered trademark) blade is pressed into a portion which is on the surface (that is, the front surface) of semiconductor laser element 5 on the first main surface 11 side of substrate 10 and which corresponds to a position opposite division groove 6. As a result, semiconductor laser element 5 is cut along division groove 6. In the present embodiment, since division groove 6 is formed at each of the two ends of semiconductor laser element 1 in the long-side direction, semiconductor laser element 5 is cut along two division grooves 6, and end portion 5*a* of semiconductor laser element 5 on the first end surface 3*a* side and end portion 5*a* of semiconductor laser element 5 on the second end surface 3*b* side are separated and removed from semiconductor laser element 5 as illustrated in FIG. 10.

At this time, since debris 3D and 4D and cleavage lead-in grooves 4 are present at end portion 5*a* of semiconductor laser element 5 on the first end surface 3*a* side, removal of end portion 5*a* of semiconductor laser element 5 on the first end surface 3*a* side allows removal of debris 3D and 4D and cleavage lead-in grooves 4 from semiconductor laser element 5. Also, since debris 3D is present at end portion 5*a* of semiconductor laser element 5 on the second end surface 3*b* side, removal of end portion 5*a* of semiconductor laser element 5 on the second end surface 3*b* side allows removal of debris 3D from semiconductor laser element 5. Specifically, all debris 3D and 4D and all cleavage lead-in grooves 4 are removed from semiconductor laser element 5. In such a manner, semiconductor laser element 1 illustrated in FIG. 1 can be produced.

Figure 11:
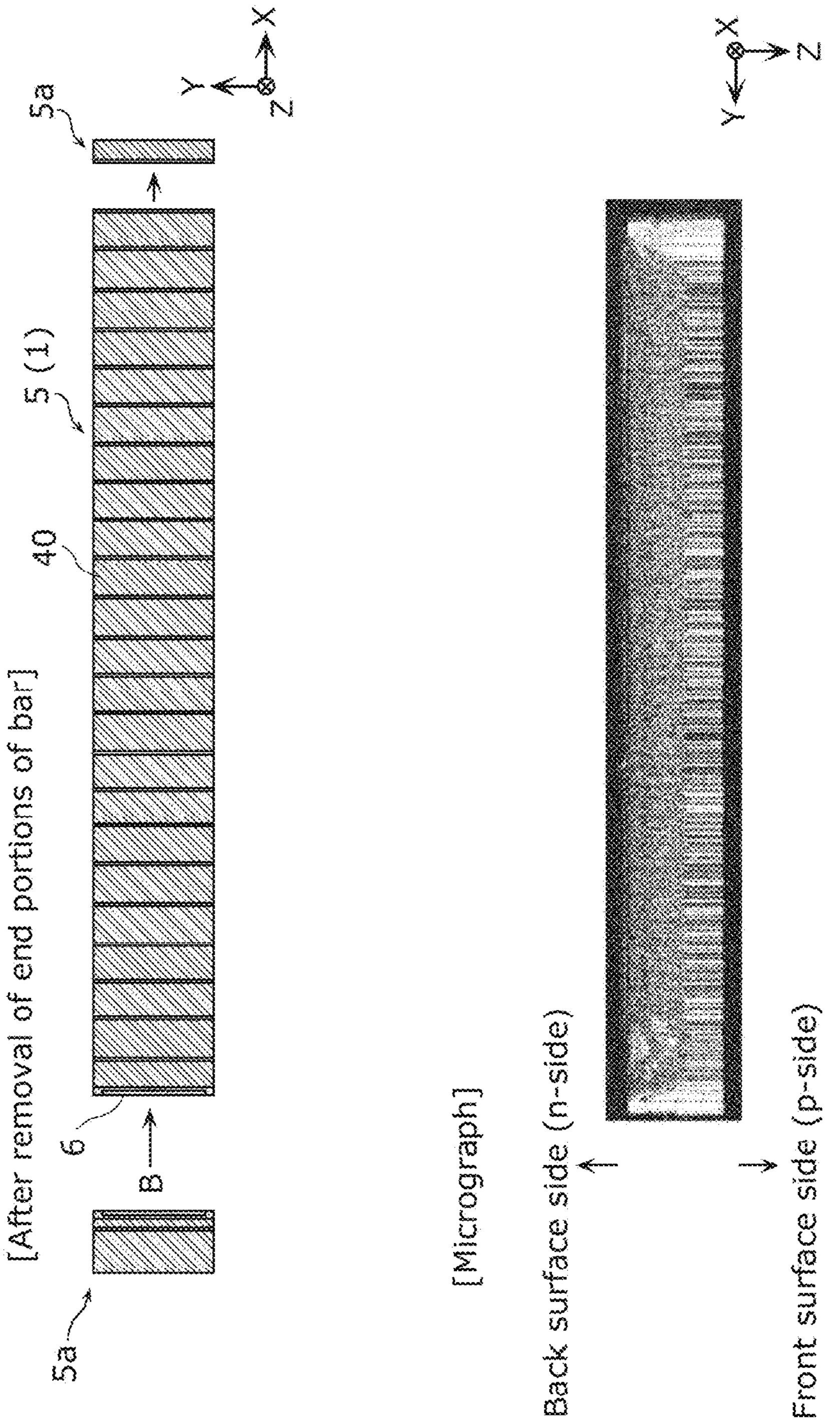
FIG. 11 is a diagram illustrating the semiconductor laser element from which the end portions have been removed and a micrograph of a first side surface of the semiconductor laser element viewed in a direction from B.

An SEM image of first side surface 1*a* of semiconductor laser element 1 produced in the above manner is illustrated in FIG. 11. FIG. 11 illustrates semiconductor laser element 5 from which end portions 5*a* have been removed and a micrograph of first side surface 1*a* of semiconductor laser element 5 viewed in a direction from B. The micrograph in FIG. 11 shows that part of division groove 6 remains on first side surface 1*a* of semiconductor laser element 1. This remaining part of division groove 6 is stepped portion 50 of semiconductor laser element 1 illustrated in FIG. 1 and FIG. 2.

Note that after the removal of debris 3D and 4D and cleavage lead-in grooves 4, an end surface coating films is formed on each resonator end surface of semiconductor laser element 1 (an end surface coating process). For example, an end surface coating film having a reflectance of 16% is formed on third side surface 1*c* which is the front end surface of semiconductor laser element 1, and an end surface coating film having a reflectance of at least 95% is formed on fourth side surface 1*d* which is the rear end surface of semiconductor laser element 1. A dielectric multilayer film can be used as the end surface coating film.

[Advantageous Effects Etc.]

As described above, the method of manufacturing semiconductor laser element 1 according to the present embodiment includes: a first division process of dividing substrate 10 in the Y axis direction (the first direction) to produce a plurality of divided substrates 3 each including a plurality of waveguides 21, substrate 10 being a substrate on which nitride-based semiconductor laser stacking structure 20 is formed, nitride-based semiconductor laser stacking structure 20 including a plurality of waveguides 21 each extending in the Y axis direction; a cleavage process of cleaving, in the X axis direction (the second direction), one divided substrate 3 included in the plurality of divided substrates 3 produced by the first division process, to produce a plurality of semiconductor laser elements 5 each including a plurality of waveguides 21; and a second division process of dividing, in the Y axis direction, one semiconductor laser element 5 included in the plurality of semiconductor laser elements 5 produced by the cleavage process, to remove at least one end portion of one semiconductor laser element 5 in the long-side direction (the second direction orthogonal to waveguides 21). The cleavage process includes: a first cleavage process of forming cleavage lead-in groove 4 on one divided substrate 3, cleavage lead-in groove 4 extending in the X axis direction; and a second cleavage process of cleaving one divided substrate 3 in the long-side direction (the second direction orthogonal to waveguides 21) using cleavage lead-in groove 4, and in the second division process, a portion including cleavage lead-in groove 4 is removed as the at least one end portion of one semiconductor laser element 5 in the long-side direction.

With this configuration, it is possible to remove debris 3D deposited in the vicinity of the division interface and at the scratch on the division interface generated when substrate 10 is divided into divided substrates 3 in the first division process. In addition, it is possible to remove cleavage lead-in grooves 4 (grooves for division) themselves that are formed when divided substrate 3 is divided into semiconductor laser elements 5 in the cleavage process, and it is also possible to remove debris 4D deposited in the periphery of cleavage lead-in grooves 4 during the formation of cleavage lead-in grooves 4. As a result, it is possible to obtain semiconductor laser element 1 having no cleavage lead-in grooves 4 or debris 3D and 4D in the mounting region for mounting semiconductor laser element 1 on, for example, a submount.

Accordingly, it is possible to inhibit occurrence of defects when mounting semiconductor laser element 1 on, for example, a submount.

Also, in the first cleaving process of the cleaving process included in the method of manufacturing semiconductor laser element 1 according to the present embodiment, cleavage lead-in grooves 4 are formed on the surface (the front surface) of divided substrate 3 on the first main surface 11 side of substrate 10.

With this configuration, cleavage lead-in grooves 4 can be formed by being accurately aligned with the shape of nitride-based semiconductor laser stacking structure 20 (that is, the mask pattern) formed on the first main surface 11 side of substrate 10. As a result, waveguides 21 can be produced at predetermined positions with accuracy.

In the groove forming process of forming division grooves 6 by laser scribing in the method of manufacturing semiconductor laser element 1 according to the present embodiment, division grooves 6 are formed on the surface (the back surface) of semiconductor laser element 5 on the second main surface 12 side, and in the second division process, a portion including cleavage lead-in grooves 4 is removed by dividing semiconductor laser element 5 along division groove 6.

As described, since division grooves 6 for removing cleavage lead-in grooves 4 and debris 3D and 4D are formed on the back surface of semiconductor laser element 5, cleavage lead-in grooves 4 and debris 3D and 4D do not remain on the front surface of semiconductor laser element 1 (the surface on the p-side electrode 30 side) that serves as the mounting surface of semiconductor laser element 1. As a result, it is possible to easily mount semiconductor laser element 1 on, for example, a submount by junction-down mounting with p-side electrodes 30 facing downward.

Also, in the groove forming process included in the method of manufacturing semiconductor laser element 1 according to the present embodiment, division grooves 6 are formed to extend in the Y axis direction, and division grooves 6 do not reach third side surface 1*c* formed on semiconductor laser element 5 by the second cleavage process.

With this configuration, it is possible to inhibit debris 6D generated during the formation of division grooves 6 by laser scribing from attaching to third side surface 1*c* which is a resonator end surface of semiconductor laser element 5.

If division grooves 6 are formed to reach third side surface 1*c* of semiconductor laser element 5, even the resin sheet on which semiconductor laser element 5 is placed may be cut when forming division grooves 6 by, for example, laser scribing, and the debris scattering from the resin sheet by this cutting may attach to third side surface 1*c* of semiconductor laser element 5. In contrast, by forming division grooves 6 not to reach third side surface 1*c* of semiconductor laser element 5 as in the present embodiment, it is possible to prevent debris from scattering from the resin sheet and prevent debris scattering from the resin sheet from attaching to third side surface 1*c* of semiconductor laser element 5.

In addition, in the method of manufacturing semiconductor laser element 1 according to the present embodiment, division grooves 6 do not reach fourth side surface 1*d* of semiconductor laser element 5 either.

With this configuration, it is possible to inhibit debris 6D generated during the formation of division grooves 6 by laser scribing from attaching to fourth side surface 1*d* which is a resonator end surface of semiconductor laser element 5. In addition, it is also possible to prevent debris scattering from the resin sheet on which semiconductor laser element 5 is placed from attaching to fourth side surface 1*d* of semiconductor laser element 5 during the formation of division grooves 6 by, for example, laser scribing.

Also, with the method of manufacturing semiconductor laser element 1 according to the present embodiment, since it is possible to form first side surface 1*a* and second side surface 1*b* of semiconductor laser element 1 at arbitrary positions using division grooves 6, it is also possible to arbitrarily and accurately set the distance between waveguide 21 and first side surface 1*a* of semiconductor laser element 1 and the distance between waveguide 21 and second side surface 1*b* of semiconductor laser element 1.

In this case, in semiconductor laser element 1 manufactured by the method of manufacturing semiconductor laser element 1 according to the embodiment, second distance d2, which is the distance between first side surface 1*a* and waveguide 21 located closest to first side surface 1*a* among the plurality of waveguides 21, is greater than first distance d1, which is the shortest distance among distances between two adjacent waveguides.

Figure 12A:
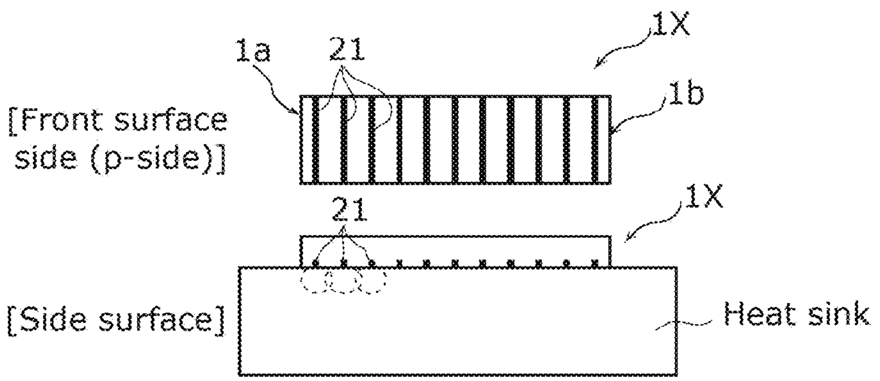
FIG. 12A is a diagram illustrating a state in which a semiconductor laser element of a comparative example is mounted junction-down on a heat sink.
Figure 12B:
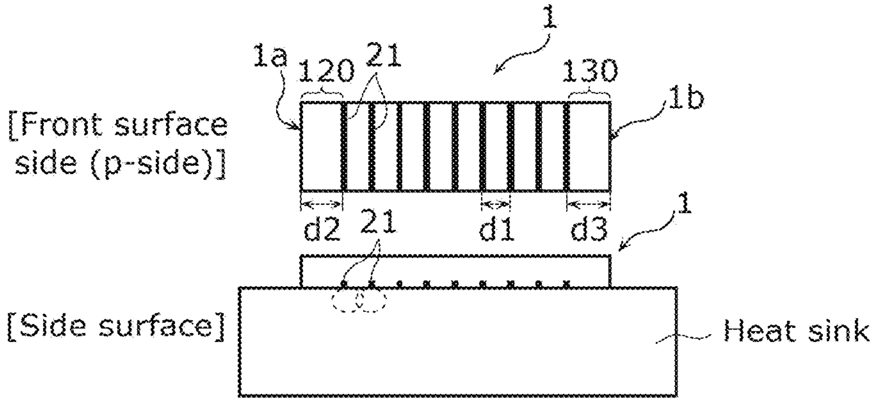
FIG. 12B is a diagram illustrating a state in which the semiconductor laser element according to the embodiment is mounted junction-down on a heat sink.

With this configuration, it is possible to obtain semiconductor laser element 1 having excellent heat dissipation property. This point will be described in comparison with semiconductor laser element 1X of a comparative example with reference to FIG. 12A and FIG. 12B. FIG. 12A is a diagram illustrating a state in which semiconductor laser element 1X of the comparative example is mounted junction-down on a heat sink. FIG. 12B is a diagram illustrating a state in which semiconductor laser element 1 according to the embodiment is mounted junction-down on a heat sink. Note that in FIG. 12A and FIG. 12B, the circles surrounded by dashed lines show the spread of heat centered on the emitters corresponding to waveguides 21.

As illustrated in FIG. 12A, in semiconductor laser element 1X of the comparative example, the distance between a side surface and waveguide 21 located closest to the side surface among a plurality of waveguides 21 is less than the pitch of waveguides 21, and thus, when semiconductor laser element 1X is mounted junction-down on a submount, which is a heat sink, waveguide 21 located closest to the side surface in the long-side direction has a narrow heat dissipation path as compared to other waveguides 21. In other words, when waveguide 21 located at the end is too close to the side surface of semiconductor laser element 1X in the long-side direction, the heat dissipation path of waveguide 21 located at the end becomes limited. As a result, waveguide 21 located closest to the side surface in the long-side direction becomes more susceptible to degradation over time than other waveguides 21, and this becomes a factor for degradation of the overall properties of semiconductor laser element 1X.

In contrast, with semiconductor laser element 1 according to the present embodiment, second distance d2 is greater than first distance d1. That is to say, the distance between first side surface 1*a* and waveguide 21 located closest to first side surface 1*a* among the plurality of waveguides 21 is greater than the pitch of waveguides 21. With this, as illustrated in FIG. 12B, when semiconductor laser element 1 according to the present embodiment is mounted junction-down on a submount, which is a heat sink, waveguide 21 located closest to first side surface 1*a* can be distanced from first side surface 1*a* as compared to other waveguides 21, and thus, it is possible to ensure a sufficiently wide heat dissipation path. As a result, it is possible to obtain semiconductor laser element 1 having excellent heat dissipation property as a whole, and it is possible to inhibit occurrence of defects when mounting semiconductor laser element 1 on, for example, a submount. In particular, it is possible to inhibit defects that occur when semiconductor laser element 1 is mounted junction-down.

Also, in semiconductor laser element 1 according to the present embodiment, third distance d3, which is a distance between second side surface 1*b* and waveguide 21 located closest to second side surface 1*b* among the plurality of waveguides 21, is greater than first distance d1.

With this, it is possible to ensure a sufficiently wide heat dissipation path for each of waveguides 21 located at the two end portions of semiconductor laser element 1 in the long-side direction. With this, it is possible to obtain semiconductor laser element 1 having further excellent heat dissipation property as a whole.

[Variation of Semiconductor Laser Element]

Figure 13:
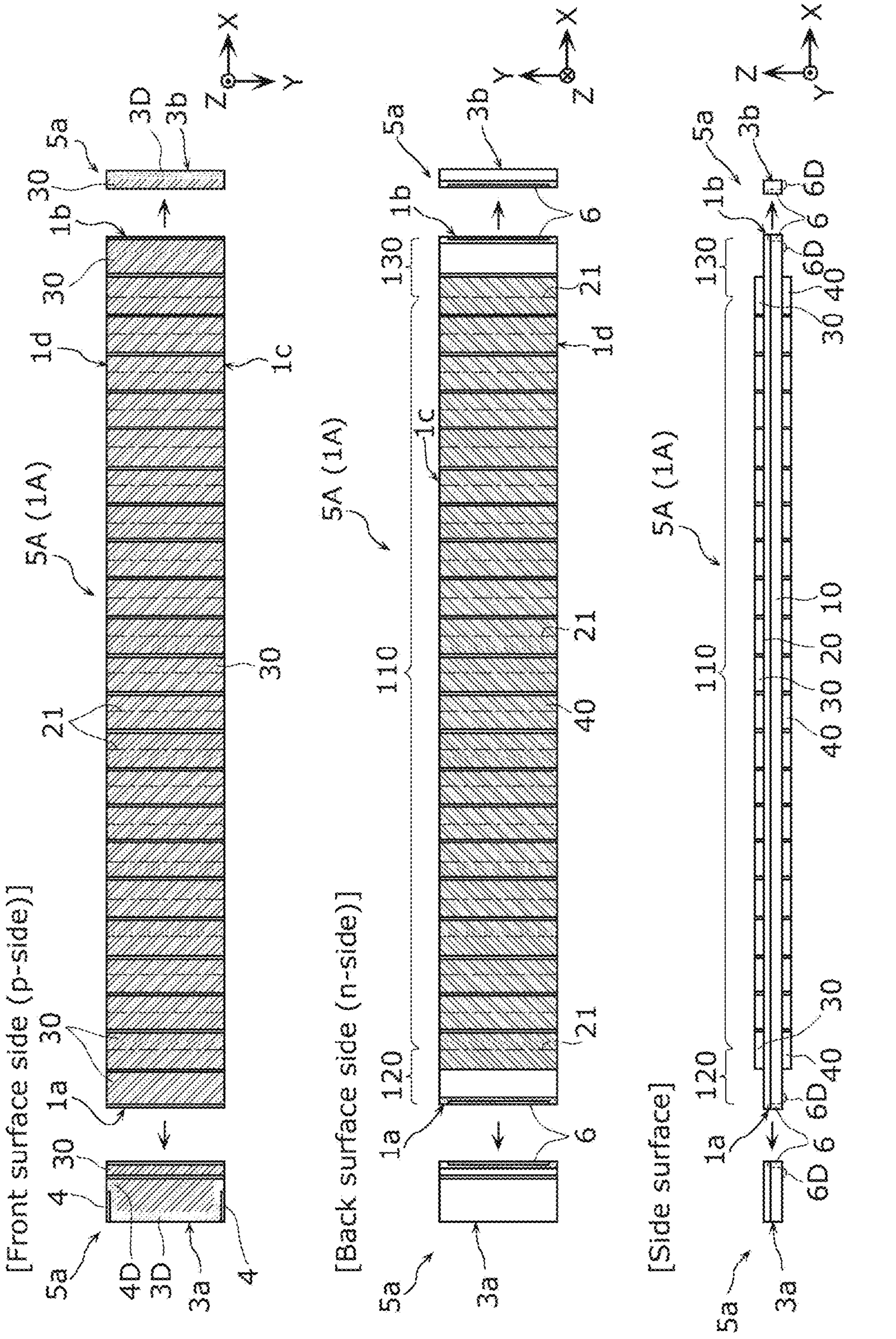
FIG. 13 is a diagram illustrating a configuration of a semiconductor laser element according to a variation.

In the above embodiment, n-side electrodes 40 are formed on the entire back surface of semiconductor laser element 1, and second region 120 and third region 130 are regions that do not function as a semiconductor laser as a result of not forming waveguide 21 in second region 120 or third region 130. The present disclosure, however, is not limited to this. For example, as illustrated in FIG. 13, second region 120 and third region 130 may be regions that do not function as a semiconductor laser as a result of not forming n-side electrodes 40 in second region 120 or third region 130. FIG. 13 is a diagram illustrating a configuration of semiconductor laser element 5A (1A) according to the variation.

In this case, semiconductor laser element 5A (1A) according to the present variation can be manufactured by the same method as the method of manufacturing semiconductor laser element 5 (1) in the above embodiment. In this case, in the present variation too, division grooves 6 are formed on the back surface of semiconductor laser element 5A rather than on the front surface in the groove forming process as in the above embodiment, and thus, debris 6D generated during the formation of division grooves 6 by laser scribing is not present on the front surface of semiconductor laser element 5A.

However, since division grooves 6 are formed on the back surface of semiconductor laser element 5A, debris 6D generated during the formation of division grooves 6 is deposited on the back surface of semiconductor laser element 5A (the surface on the second main surface 12 side). Specifically, debris 6D is deposited at the periphery of division grooves 6, that is, debris 6D is deposited on second main surface 12 of substrate 10 in second region 120 and third region 130 which are in the vicinity of first side surface 1*a* and second side surface 1*b* and in which n-side electrodes 40 are not formed.

In view of this, with semiconductor laser element 5A (1A) according to the present variation, n-side electrodes 40 formed at more inward positions than the regions in which debris 6D is deposited are given a thickness greater than the height of debris 6D. As an example, since the height of debris 6D is 1 μm at maximum, the thickness of n-side electrode 40 is 1 μm or greater, and more preferably 2 μm or greater.

In this case, it is favorable to provide n-side electrodes 40 at a sufficient distance from division grooves 6 and debris 6D (for example, at a distance of 30 μm or greater from division grooves 6). With this, it is possible to inhibit deposition of debris 6D on the surfaces of n-side electrodes 40.

In such a manner, by forming n-side electrodes 40 away from the positions where debris 6D is deposited and making the thickness of n-side electrodes 40 greater than the height of debris 6D, it is possible to inhibit debris 6D deposited on the back surface of semiconductor laser element 1A from becoming an obstacle in the case of connecting also the surface of semiconductor laser element 1A on the n-side electrode 40 side to, for example, a heat sink to improve the heat dissipation.

[Semiconductor Laser Device]

Next, semiconductor laser devices that include semiconductor laser element 1 according to the embodiment will be described.

Figure 14:
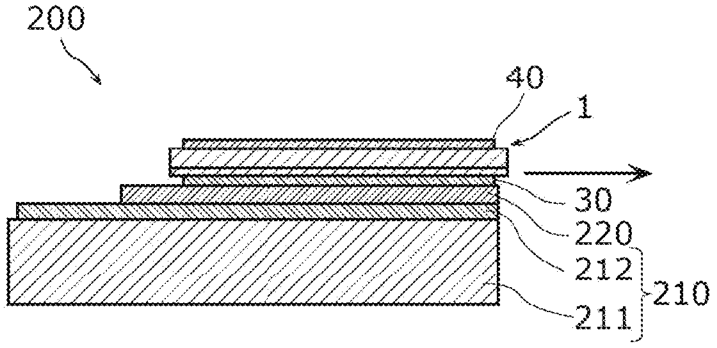
FIG. 14 is a diagram illustrating a configuration of a first semiconductor laser device according to the embodiment.

First, first semiconductor laser device 200 that includes semiconductor laser element 1 according to the embodiment will be described with reference to FIG. 14. FIG. 14 is a diagram illustrating a configuration of first semiconductor laser device 200 according to the embodiment.

As illustrated in FIG. 14, first semiconductor laser device 200 according to the present embodiment includes semiconductor laser element 1 described above and submount 210 on which semiconductor laser element 1 is mounted.

Submount 210 includes base 211 and electrode layer 212 stacked on the upper surface of base 211. It is favorable that base 211 include a material having a high thermal conductivity and a low thermal expansion coefficient. Possible materials of base 211 include, for example, SiC ceramic, AlN ceramic, semi-insulating SiC crystal, and artificial diamond. A metal material such as an alloy of Cu and W or an alloy of Cu and Mo may also be used for base 211. Electrode layer 212 includes, for example, Ti/Pt/Au in this order from the base 211 side.

In the present embodiment, semiconductor laser element 1 is mounted on submount 210 with the surface of semiconductor laser element 1 on the first main surface 11 side of substrate 10, facing submount 210. In other words, semiconductor laser element 1 is mounted junction-down on submount 210 with p-side electrodes 30, which are formed on the front surface side, facing submount 210.

Semiconductor laser element 1 is mounted on submount 210 via bonding layer 220. In the present embodiment, semiconductor laser element 1 is electrically connected to electrode layer 212 of submount 210. Therefore, for example, a metal bonding material such as AuSn solder is used as bonding layer 220.

Accordingly, since first semiconductor laser device 200 includes semiconductor laser element 1 described above, it is possible to mount semiconductor laser element 1 on submount 210 without any defects during mounting.

Figure 15:
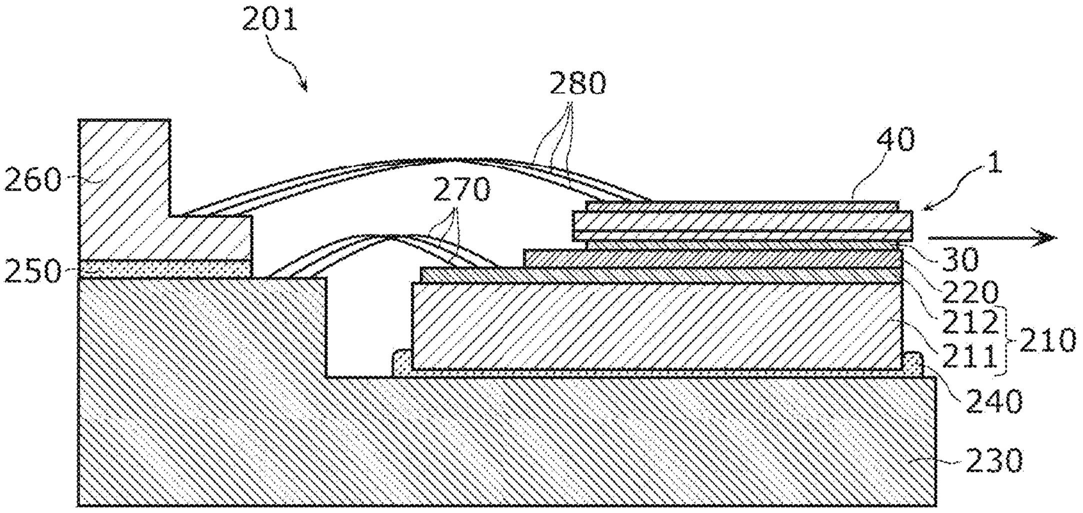
FIG. 15 is a diagram illustrating a configuration of a second semiconductor laser device according to the embodiment.

Next, second semiconductor laser device 201 that includes semiconductor laser element 1 according to the embodiment will be described with reference to FIG. 15. FIG. 15 is a diagram illustrating a configuration of second semiconductor laser device 201 according to the embodiment.

As illustrated in FIG. 15, second semiconductor laser device 201 according to the present embodiment includes semiconductor laser element 1 described above, submount 210 on which semiconductor laser element 1 is mounted, and heat sank 230. That is to say, second semiconductor laser device 201 includes heat sink 230 in addition to the configuration of first semiconductor laser device 200 illustrated in FIG. 14.

Specifically, submount 210 on which semiconductor laser element 1 is mounted by a submount mounting process is disposed on heat sink 230 by a heat sink mounting process. For example, a water-cooled heat sink made of Cu can be used as heat sink 230. Submount 210 on which semiconductor laser element 1 is mounted is bonded to the upper surface of heat sink 230 using, for example, bonding material 240. As bonding material 240, it is possible to use, for example, an electrically-conductive bonding material having a high thermal conductivity such as SnAgCu solder (SAC solder).

With heat sink 230 serving as a positive electrode, second semiconductor laser device 201 according to the present embodiment further includes: negative electrode 260 provided on heat sink 230 via insulation layer 250; first metal wires 270; and second metal wires 280.

Specifically, by a wire bonding process, electrode layer 212 of submount 210 and heat sink 230 are connected by a plurality of first metal wires 270. Also, n-side electrodes 40 of semiconductor laser element 1 and negative electrode 260 are connected by a plurality of second metal wires 280. For example, gold wires can be used as first metal wires 270 and second metal wires 280. A Cu block can be used as negative electrode 260. Note that in the case where base 211 of submount 210 has electrical conductivity by including, for example, metal, first metal wires 270 are unnecessary.

As described, according to second semiconductor laser device 201, semiconductor laser element 1 is thermally connected to heat sink 230, and thus, the heat generated by semiconductor laser element 1 can be efficiently dissipated. This makes it possible to realize a semiconductor laser device capable of high-power operation.

Figure 16:
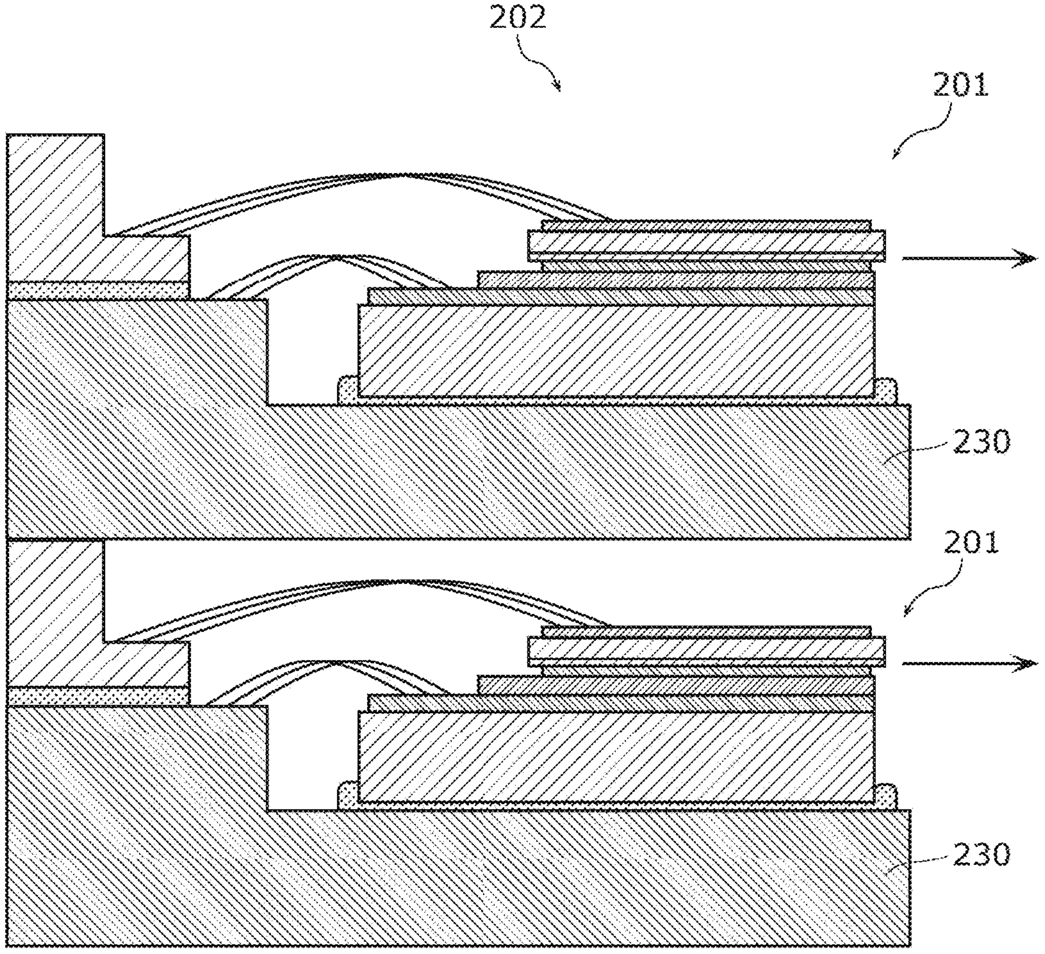
FIG. 16 is a diagram illustrating a configuration of a third semiconductor laser device according to the embodiment.

Next, third semiconductor laser device 202 that includes semiconductor laser element 1 according to the embodiment will be described with reference to FIG. 16. FIG. 16 is a diagram illustrating a configuration of third semiconductor laser device 202 according to the embodiment.

As illustrated in FIG. 16, third semiconductor laser device 202 according to the present embodiment includes a plurality of second semiconductor laser device 201 illustrated in FIG. 15. Specifically, third semiconductor laser device 202 can be manufactured by stacking second semiconductor laser devices 201 each having heat sink 230, by a stacking process. In this case, heat sink 230 (the positive electrode) of second semiconductor laser device 201 located above and negative electrode 260 of second semiconductor laser device 201 located below are electrically connected. That is to say, two semiconductor laser elements 1 included in two second semiconductor laser devices 201 located above and below are electrically connected in series.

Note that in the present embodiment, two second semiconductor laser devices 201 are stacked; however, the present disclosure is not limited to this. For example, three or more second semiconductor laser devices 201 may be stacked. That is to say, second semiconductor laser devices 201 may be stacked sequentially.

As described, since third semiconductor laser device 202 includes a plurality of second semiconductor laser devices 201 illustrated in FIG. 15, high optical output can be easily obtained.

Figure 17:
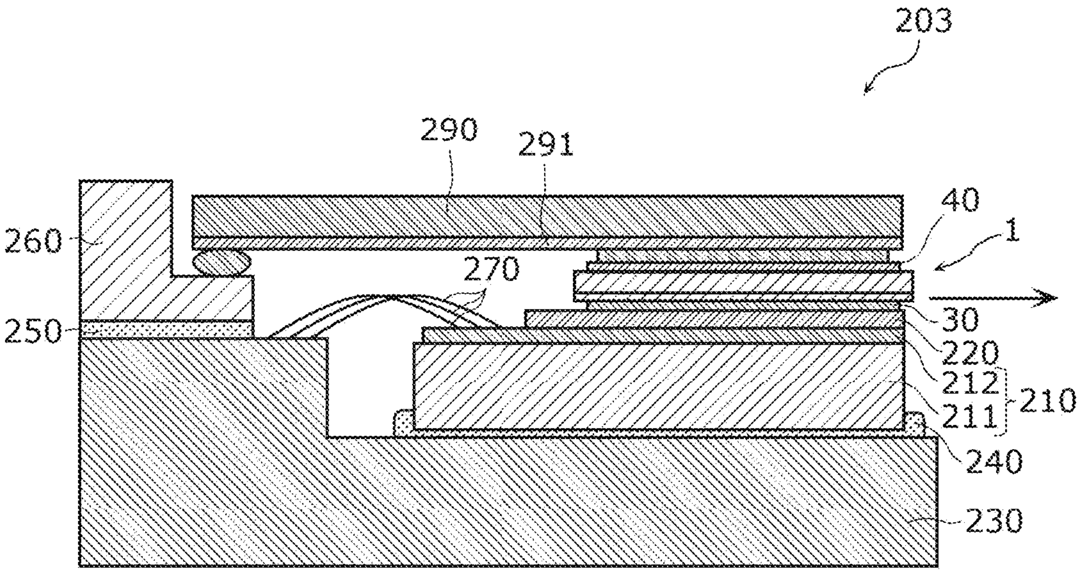
FIG. 17 is a diagram illustrating a configuration of a fourth semiconductor laser device according to the embodiment.

Next, fourth semiconductor laser device 203 that includes semiconductor laser element 1 according to the embodiment will be described with reference to FIG. 17. FIG. 17 is a diagram illustrating a configuration of fourth semiconductor laser device 203 according to the embodiment.

As illustrated in FIG. 17, fourth semiconductor laser device 203 according to the present embodiment has the configuration of second semiconductor laser device 201 illustrated in FIG. 15 except that heat dissipation plate 290 on which electrode layer 291 is formed is used instead of second metal wires 280.

Heat dissipation plate 290 functions as a heat sink. Therefore, it is favorable that heat dissipation plate 290 be made of a material having a high thermal conductivity. Electrode layer 291 is formed on the surface of heat dissipation plate 290. Electrode layer 291 is, for example, an Au layer. Electrode layer 291 is electrically connected to n-side electrodes 40 of semiconductor laser element 1 by an electrically-conductive bonding material such as AuSn solder. Also, electrode layer 291 and negative electrode 260 are electrically connected by a solder bump. Use of the solder bump enables not only the electrical bonding of electrode layer 291 and negative electrode 260 but also absorption of the height difference between heat dissipation plate 290 and negative electrode 260.

As described, according to fourth semiconductor laser device 203, heat dissipation plate 290 provides an additional heat dissipation path for the heat generated by semiconductor laser element 1 as compared to second semiconductor laser device 201 illustrated in FIG. 15. This makes it possible to realize a semiconductor laser device capable of higher-power operation.

Note that with regard to semiconductor laser element 1 illustrated in FIG. 1, since the formation of division grooves 6 by laser scribing causes deposition of debris 6D on n-side electrodes 40, debris 6D may become an obstacle when bonding heat dissipation plate 290. In view of this, it is favorable that fourth semiconductor laser device 203 include, rather than semiconductor laser element 1 illustrated in FIG. 1, semiconductor laser element 1A illustrated in FIG. 13 that includes n-side electrodes 40 that are disposed away from the positions where debris 6D is deposited and are thicker than the height of debris 6D.

Variations

Although a method of manufacturing a semiconductor laser element, the semiconductor laser element, and a semiconductor laser device according to the present disclosure have been described above based on an embodiment, the present disclosure is not limited to the above embodiment.

For example, in the above embodiment, twenty-one waveguides 21 each having a width of 30 μm are formed at distances of 400 μm in semiconductor laser element 1 having a width of 9200 μm in the long-side direction and a length of 1200 μm in the resonator length direction; however, the present disclosure is not limited to this. Specifically, thirty-seven waveguides 21 each having a width of 30 μm may be formed at distances of 225 μm (=d1) in a semiconductor laser having a width of 9200 μm in the long-side direction and a length of 1200 μm in the resonator length direction. In this case, second distance d2 and third distance d3 are, for example, d2=d3=550 μm.

Alternatively, fifty-six waveguides 21 each having a width of 30 μm may be formed at distances of 150 μm (=d1) in a semiconductor laser having a width of 9200 μm in the long-side direction and a length of 1200 μm in the resonator length direction. In this case, second distance d2 and third distance d3 are, for example, d2=d3=475 μm.

The distances between the plurality of waveguides 21 and the width of the plurality of waveguides 21 need not be the same for all waveguides 21. The widths and positions of the individual waveguides are determined according to the designed output of the semiconductor laser element and the design of the heat dissipation circuit.

Further, in the above embodiment, second region 120 and third region 130 are regions that do not function as a semiconductor laser as a result of not forming waveguide 21 in second region 120 or third region 130. The present disclosure, however, is not limited to this. For example, even if p-side electrodes 30 and waveguides 21 are formed in second region 120 and third region 130, second region 120 and third region 130 may be regions that do not function as a semiconductor laser as a result of making separation between p-side electrodes 30 and waveguides 21 with an insulating film so that second region 120 and third region 130 are electrically not connected.

In the above embodiment, waveguides 21 in semiconductor laser element 1 have a ridge stripe structure, but the present disclosure is not limited to this. For example, waveguides 21 may have an electrode stripe structure including only electrodes that are divided without forming ridge stripes, or waveguides 21 may have, for example, a current narrowing structure that includes a current blocking layer.

In the above embodiment, the long-side direction of semiconductor laser element 1 has been described as the direction orthogonal to waveguides 21; however, when the number of waveguides is small, the direction parallel to the laser resonator length may be the long-side direction of semiconductor laser element 1. For example, it is possible to form semiconductor laser element 1 in which two waveguides 21 each having a length of 1200 μm in the resonator length direction are formed at distances of 150 μm (=d1) and second distance d2 and third distance d3 on the respective outer sides of the two waveguides 21 are 475 μm. In this case, the length in the resonator length direction, which is 1200 μm, is greater than the width of semiconductor laser element, which is 1100 μm (475 μm+150 μm+475 μm).

As long as the distances between waveguides 21 of semiconductor laser element 1 are appropriate and a heat sink with a good heat dissipation property and its cooling mechanism are provided, it is possible to obtain a total optical output of semiconductor laser element 1 close to an optical output calculated by multiplying an optical output extractable from one waveguide 21 by a total number of waveguides. For example, with a semiconductor laser element having a maximum of sixty waveguides or less can achieve: an optical output of at least 60 W and at most 300 W in the case of a semiconductor laser having a wavelength in a range of from 365 nm to 390 nm; an optical output of at least 180 W and at most 600 W in the case of a semiconductor laser having a wavelength in a range of from 390 nm to 420 nm; an optical output of at least 360 W and at most 900 W in the case of a semiconductor laser having a wavelength in a range of from 420 nm to 460 nm; and an optical output of at least 180 W and at most 900 W in the case of a semiconductor laser having a wavelength in a range of from 460 nm to 500 nm.

In addition, although the above embodiment has illustrated the case where the nitride-based semiconductor material is used in semiconductor laser element 1, the present disclosure is not limited to this. For example, the present disclosure is also applicable to the case where a semiconductor material other than the nitride-based semiconductor material is used. In this case, semiconductor laser element 1 includes, rather than nitride-based semiconductor laser stacking structure 20, a semiconductor laser stacking structure in which another semiconductor material is used.

Although the above embodiment has illustrated the case of manufacturing a semiconductor laser element which is a laser bar including a plurality of waveguides 21, semiconductor laser element 1 which is a laser bar including a plurality of waveguides 21 may be further divided into a plurality of pieces to produce single-emitter semiconductor laser elements each including one waveguide 21.

The present disclosure also encompasses other forms achieved by making various modifications conceivable to those skilled in the art to the embodiment, as well as forms resulting from arbitrary combinations of constituent elements and functions from different embodiments that do not depart from the essence of the present disclosure.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The semiconductor laser element according to the present disclosure is useful as a light source for various applications, including a light source for image display devices such as projectors and displays, a light source for automotive headlamps, a light source for illumination devices, and a light source for various industrial equipment such as laser welding devices, thin-film annealing devices, and laser processing devices.

The invention claimed is:

1. A semiconductor laser element comprising:

a substrate including a first main surface and a second main surface on an opposite side relative to the first main surface;

a nitride-based semiconductor laser stacking structure provided above the first main surface of the substrate and including a plurality of waveguides extending in a first direction parallel to the first main surface; and a first side surface orthogonal to the first main surface and parallel to the first direction, a second side surface on an opposite side relative to the first side surface, and a third side surface orthogonal to the first main surface and orthogonal to the first direction, wherein a second distance is greater than a first distance which is a shortest distance among distances between two adjacent waveguides included in the plurality of waveguides, the second distance being a distance between the first side surface and one waveguide located closest to the first side surface among the plurality of waveguides, the second main surface of the substrate comprises debris, an electrode is provided on the second main surface at a more inward position than a region in which the debris is deposited, and a thickness of the electrode is greater than a height of the debris.

2. The semiconductor laser element according to claim 1, wherein a third distance is greater than the first distance, the third distance being a distance between the second side surface and one waveguide located closest to the second side surface among the plurality of waveguides.

3. The semiconductor laser element according to claim 1, wherein at least three contiguous waveguides included in the plurality of waveguides are arranged with the first distance.

4. The semiconductor laser element according to claim 1, wherein at least three waveguides are included in the plurality of waveguides, and the second distance is greater than a distance between one of the two adjacent waveguides having the first distance and an adjacent waveguide that is adjacent to the one of the two adjacent waveguides and other than another of the two adjacent waveguides.

5. The semiconductor laser element according to claim 1, wherein at least three waveguides are included in the plurality of waveguides, and the second distance is greater than a distance which is a largest distance among distances between two adjacent waveguides included in the plurality of waveguides.

6. The semiconductor laser element according to claim 1, wherein the third side surface is a cleavage surface, and a flatness of the third side surface is greater than a flatness of the first side surface and a flatness of the second side surface.

7. The semiconductor laser element according to claim 1, further comprising:

a first region in which waveguides included in the plurality of waveguides are formed; and a second region that is interposed between the first region and the first side surface.

8. The semiconductor laser element according to claim 7, further comprising:

a third region that is interposed between the first region and the second side surface.

9. The semiconductor laser element according to claim 8, wherein a third distance is greater than the first distance, the third distance being a distance between the second side surface and one waveguide located closest to the second side surface among the plurality of waveguides.

10. The semiconductor laser element according to claim 1, further comprising a stepped portion provided on the first side surface, the stepped portion being recessed inwardly from a surface of the semiconductor laser element on a second main surface side.

11. The semiconductor laser element according to claim 10, wherein the stepped portion does not reach the third side surface.

12. A semiconductor laser element comprising:

a substrate including a first main surface and a second main surface on an opposite side relative to the first main surface;

a nitride-based semiconductor laser stacking structure provided above the first main surface of the substrate and including a plurality of waveguides extending in a first direction parallel to the first main surface; and a first side surface orthogonal to the first main surface and parallel to the first direction, a second side surface on an opposite side relative to the first side surface, and a third side surface orthogonal to the first main surface and orthogonal to the first direction, wherein a second distance is greater than a first distance which is a largest distance among distances between two adjacent waveguides included in the plurality of waveguides, the second distance being a distance between the first side surface and one waveguide located closest to the first side surface among the plurality of waveguides, the second main surface of the substrate comprises debris, an electrode is provided on the second main surface at a more inward position than a region in which the debris is deposited, and a thickness of the electrode is greater than a height of the debris.

13. The semiconductor laser element according to claim 12, wherein a third distance is greater than the first distance, the third distance being a distance between the second side surface and one waveguide located closest to the second side surface among the plurality of waveguides.

14. The semiconductor laser element according to claim 12, wherein at least three contiguous waveguides included in the plurality of waveguides are arranged with the first distance.

15. The semiconductor laser element according to claim 12, wherein the third side surface is a cleavage surface, and a flatness of the third side surface is greater than a flatness of the first side surface and a flatness of the second side surface.

16. The semiconductor laser element according to claim 12, further comprising:

a first region in which waveguides included in the plurality of waveguides are formed; and a second region that is interposed between the first region and the first side surface.

17. The semiconductor laser element according to claim 16, further comprising:

a third region that is interposed between the first region and the second side surface.

18. The semiconductor laser element according to claim 17, wherein a third distance is greater than the first distance, the third distance being a distance between the second side surface and one waveguide located closest to the second side surface among the plurality of waveguides.

* * * * *